United States Patent
Lee

(10) Patent No.: US 8,791,722 B2
(45) Date of Patent: Jul. 29, 2014

(54) OUTPUT BUFFER, OPERATING METHOD THEREOF AND DEVICES INCLUDING THE SAME

(75) Inventor: Seung Ho Lee, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 13/536,471

(22) Filed: Jun. 28, 2012

(65) Prior Publication Data

US 2013/0113542 A1    May 9, 2013

(30) Foreign Application Priority Data

Nov. 7, 2011 (KR) .................... 10-2011-0115101

(51) Int. Cl.
*H03K 3/00* (2006.01)
(52) U.S. Cl.
USPC .......................................... 327/108; 326/87
(58) Field of Classification Search
USPC .......................................... 327/108; 326/87
See application file for complete search history.

(56) References Cited

U.S. PATENT DOCUMENTS

| | | | | |
|---|---|---|---|---|
| 5,124,585 A * | 6/1992 | Kim et al. | .................... | 326/87 |
| 5,220,209 A * | 6/1993 | Seymour | .................... | 326/27 |
| 5,331,593 A * | 7/1994 | Merritt et al. | ............ | 365/189.11 |
| 5,332,932 A * | 7/1994 | Runaldue | .................... | 326/33 |
| 5,410,262 A * | 4/1995 | Kang | .................... | 327/108 |
| 5,617,043 A * | 4/1997 | Han et al. | .................... | 326/83 |
| 6,133,756 A | 10/2000 | Kitao | | |
| 6,442,716 B1 * | 8/2002 | Kim | .................... | 714/718 |
| 6,466,487 B1 * | 10/2002 | Otsuka | .................... | 365/189.05 |
| 6,538,464 B2 * | 3/2003 | Muljono et al. | .................... | 326/27 |
| 7,449,917 B2 | 11/2008 | Cheon | | |
| 8,344,760 B2 * | 1/2013 | Du et al. | .................... | 327/108 |
| 2009/0237333 A1 | 9/2009 | Saito | | |

FOREIGN PATENT DOCUMENTS

KR    10-2010-0054605    5/2010

* cited by examiner

*Primary Examiner* — William Hernandez
(74) *Attorney, Agent, or Firm* — Onello & Mello, LLP

(57) ABSTRACT

A method of buffering data from core circuitry includes generating a first sourcing control signal responsive to indication signals indicating an operating voltage and output data, generating a second sourcing control signal responsive to the indication signals, and applying the operating voltage to an output terminal in response to the first sourcing control signal and the second sourcing control signal. The first sourcing control signal swings between the operating voltage and a reference voltage. The reference voltage is a signal selected from among a plurality of internal voltages in response to selection signals generated as a result of decoding the indication signals.

23 Claims, 24 Drawing Sheets

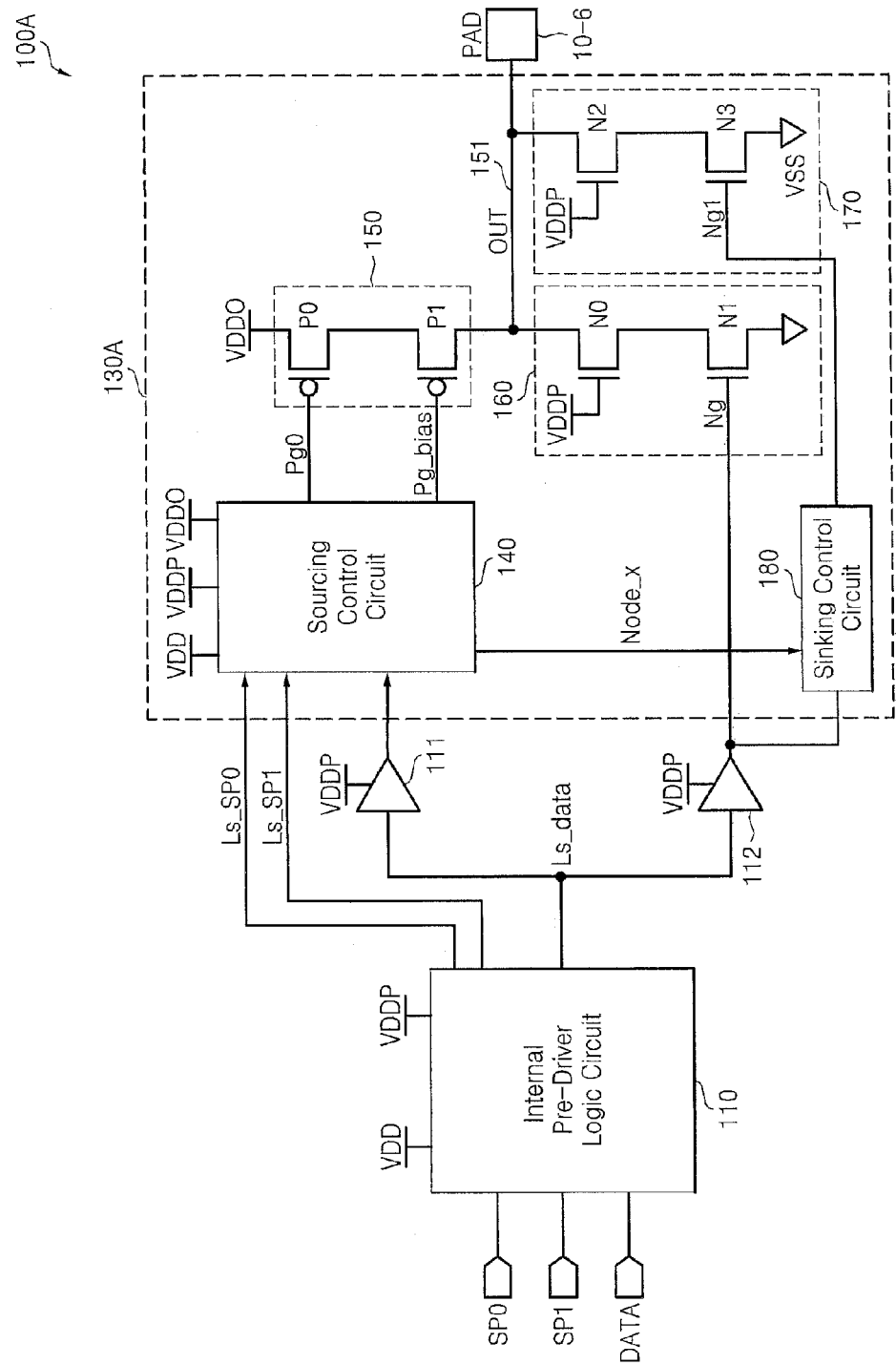

OUTPUT BUFFER, OPERATING METHOD THEREOF AND DEVICES INCLUDING THE SAME

CROSS-REFERENCE TO RELATED APPLICATIONS

This application claims priority under 35 U.S.C. §119(a) from Korean Patent Application No. 10-2011-0115101 filed on Nov. 7, 2011, the disclosure of which is hereby incorporated by reference in its entirety.

BACKGROUND

Exemplary embodiments in accordance with principles of inventive concepts relate to an output buffer, and more particularly, to an output buffer having a wide operation range, an operating method thereof, and devices including the same.

With the development of complementary metal oxide semiconductor (CMOS) processes, the internal supply voltage of integrated circuits (ICs) have been decreased in order to reduce power consumption of the ICs. However, supply voltages for input/output buffers that handle data communication, or interfacing, carried out between ICs in a printed circuit board (PCB)-based system, have not been reduced and, as a result, input/output buffer power consumption remains relatively high.

Additionally, if input/output buffer supply voltages are different in different ICs, the ICs may be damaged or may malfunction. For example, a leakage current path may be formed among the input/output buffers, which may damage or destroy the input/output buffers.

Additionally, if a voltage difference greater than a rated voltage is applied across an input/output buffer transistor's drain and gate, gate and source, or drain and source, a gate oxide layer of the buffer transistor may be destroyed, or the transistor may be damaged due to hot carrier injection (HCI).

SUMMARY

According to an exemplary embodiments in accordance with principles of inventive concepts, there is provided an operating method of an output buffer circuit. The operating method includes the operations of generating a first sourcing control signal depending on, that is, responsive to, indication signals indicating an operating voltage and output data, generating a second sourcing control signal depending on the indication signals, and applying the operating voltage to an output terminal in response to the first sourcing control signal and the second sourcing control signal.

In accordance with principles of inventive concepts, indication signals and the output data may have been level-shifted by a level shifter.

In accordance with principles of inventive concepts, a first sourcing control signal may swing between the operating voltage and a reference voltage. The reference voltage may be a signal selected from among a plurality of internal voltages in response to selection signals generated as a result of decoding the indication signals.

In accordance with principles of inventive concepts, operation of generating the first sourcing control signal may include generating selection signals by decoding the indication signals; selecting a voltage from among a plurality of internal voltages as a reference voltage in response to the selection signals and one of the indication signals; and generating the first sourcing control signal which swings between the operating voltage and the reference voltage in response to the reference voltage, the output data and the one of the indication signals.

In accordance with principles of inventive concepts, operation of the generating the second sourcing control signal may include generating a signal among a plurality of internal voltages as the second sourcing control signal in response to selection signals generated by decoding the indication signals and one of the indication signals.

An operating method in accordance with principles of inventive concepts, may further include the operations of generating a sinking control signal in response to the output data and one of selection signals generated by decoding the indication signals and applying a ground voltage to the output terminal in response to the sinking control signal.

The operation of generating the sinking control signal in accordance with principles of inventive concepts, may include generating control signals complementary to each other in response to the one of the selection signals, and outputting the output data as the sinking control signal in response to the complementary control signals.

According to other exemplary embodiments in accordance with principles of inventive concepts, there is provided an output buffer circuit including a sourcing control circuit configured to generate a first sourcing control signal, which depends on indication signals indicating a direct current (DC) level of a first voltage and output data, and a second sourcing control signal which depends on the indication signals; and a sourcing circuit configured to apply the first voltage to an output terminal in response to the first sourcing control signal and the second sourcing control signal.

In accordance with principles of inventive concepts, a sourcing control circuit may generate a voltage among a plurality of internal voltages as a reference voltage in response to selection signals generated as a result of decoding the indication signals and one of the indication signals and generate the first sourcing control signal having a swing range determined by the first voltage and the reference voltage.

In accordance with principles of inventive concepts, a sourcing control circuit may generate a voltage among a plurality of internal voltages as the second sourcing control signal in response to selection signals generated as a result of decoding the indication signals and one of the indication signals.

In accordance with principles of inventive concepts, a sourcing control circuit may include a decoding circuit configured to decode the indication signals and output selection signals; a reference voltage generation circuit configured to output a voltage among a plurality of first internal voltages as a reference voltage in response to a first indication signal among the indication signals and the selection signals; a first control signal generation circuit configured to generate the first sourcing control signal having a swing range determined by the output data, the first indication signal and the reference voltage; and a second control signal generation circuit configured to generate a voltage among a plurality of second internal voltages as the second sourcing control signal in response to the first indication signal and the selection signals.

When the sourcing circuit provides the first voltage to the output terminal in response to the first sourcing control signal, in accordance with principles of inventive concepts, the second sourcing control signal, and a third sourcing control circuit, the sourcing control circuit may further generate the third sourcing control circuit in response to the indication signals.

An output buffer circuit in accordance with principles of inventive concepts, may further include a first sinking circuit configured to apply a ground voltage to the output terminal in response to the output data, a second sinking circuit configured to apply the ground voltage to the output terminal in response to a sinking control signal, and a sinking control circuit configured to generate the sinking control signal in response to the output data and a signal among selection signals generated as a result of decoding the indication signals.

A sinking control circuit in accordance with principles of inventive concepts may include a control signal generation circuit configured to generate control signals complementary to each other in response to the signal among the selection signals and a sinking control signal generation circuit configured to output the output data as the sinking control signal in response to the complementary control signals.

According to further exemplary embodiments in accordance with principles of inventive concepts, there is provided a system on chip including a core logic circuit and an output buffer circuit configured to buffer output data of the core logic circuit.

An output buffer circuit in accordance with principles of inventive concepts may include a sourcing control circuit configured to generate a first sourcing control signal having a swing range depending on an operating voltage and a reference voltage in response to indication signals indicating a DC level of the operating voltage and the output data and generate a second sourcing control signal depending on the indication signals and a sourcing circuit configured to apply the operating voltage to an output terminal in response to the first sourcing control signal and the second sourcing control signal.

A sourcing control circuit in accordance with principles of inventive concepts may generate a voltage among a plurality of first internal voltages as the reference voltage in response to selection signals generated as a result of decoding the indication signals and one of the indication signals and generate a voltage among a plurality of second internal voltages as the second sourcing control signal in response to the selection signals and the one of the indication signals.

A system on chip in accordance with principles of inventive concepts may include a first sinking circuit configured to apply a ground voltage to the output terminal in response to the output data, a second sinking circuit configured to apply the ground voltage to the output terminal in response to a sinking control signal, and a sinking control signal generation circuit configured to generate the sinking control signal in response to the output data and one of the indication signals.

In accordance with principles of inventive concepts, a system on chip may include a plurality of pads configured to receive the indication signals. Alternatively, the indication signals and the output data may be output from the core logic circuit. As another alternative, the system on chip may further include a level detection circuit configured to detect the DC level and generate the indication signals.

In other exemplary embodiments in accordance with principles of inventive concepts, a portable device includes a system on chip including a core logic circuit and an output buffer circuit configured to buffer output data of the core logic circuit; and a display configured to display buffered output data of the output buffer circuit according to a control of a display controller.

An output buffer circuit in accordance with principles of inventive concepts may include a sourcing control circuit configured to generate a first sourcing control signal having a swing range depending on an operating voltage and a reference voltage in response to indication signals indicating a DC level of the operating voltage and the output data and generate a second sourcing control signal depending on the indication signals; a sourcing circuit configured to apply the operating voltage to an output terminal in response to the first sourcing control signal and the second sourcing control signal; a first sinking circuit configured to apply a ground voltage to the output terminal in response to the output data; a second sinking circuit configured to apply the ground voltage to the output terminal in response to a sinking control signal; and a sinking control signal generation circuit configured to generate the sinking control signal in response to the output data and one of the indication signals.

A sourcing control circuit in accordance with principles of inventive concepts may generate a voltage among a plurality of first internal voltages as the reference voltage in response to selection signals generated as a result of decoding the indication signals and one of the indication signals and generates a voltage among a plurality of second internal voltages as the second sourcing control signal in response to the selection signals and the one of the indication signals. A portable device in accordance with principles of inventive concepts may be a smart phone or a tablet personal computer (PC).

In an exemplary embodiment in accordance with principles of inventive concepts, electronic circuitry may include an output buffer configured to output data from core circuitry, the buffer configured to output data at higher voltage levels than voltage levels employed by the core circuitry, including supply voltage circuitry for providing first, second, and third supply voltages to buffer circuitry, wherein the third supply voltage is at the lowest level of the three supply voltages, the second supply voltage is at level higher than the third supply voltage, and the first supply voltage is at a level equal to or greater than the second supply voltage. Circuitry also including circuitry to determine the level of the first supply voltage, and circuitry to produce an output drive signal based on the determination of the level of the first supply voltage, wherein the output drive signal is a pull-up bias signal.

In accordance with principles of inventive concepts, the electronic circuitry may also include circuitry to produce a main pull-up drive signal based on a combination of data to be output by the buffer and the level of the first supply voltage.

In accordance with principles of inventive concepts, output drive signal circuitry may include a pull-up circuit including MOS transistors connected in series between the first supply voltage and an output terminal of the buffer.

In accordance with principles of inventive concepts, a main pull-up drive signal limits the voltage from gate to first supply of an upper MOS transistor in the pull-up circuit using a drive signal provided by a combination of data and detected level of first supply.

In accordance with principles of inventive concepts, a pull-up bias signal limits the source to drain voltage of the upper MOS transistor in the pull-up circuitry.

In accordance with principles of inventive concepts, circuitry may include pull-down circuitry to pull-down a buffer output terminal in response to a combination of data from the core and the value of the first supply voltage.

BRIEF DESCRIPTION OF THE DRAWINGS

The above and other features and advantages of the inventive concept will become more apparent by describing in detail exemplary embodiments thereof with reference to the attached drawings in which:

FIG. 3A is a block diagram of the output buffer illustrated in FIG. 1 or 2 according to some exemplary embodiments in accordance with principles of inventive concepts;

DESCRIPTION

Figure 1:
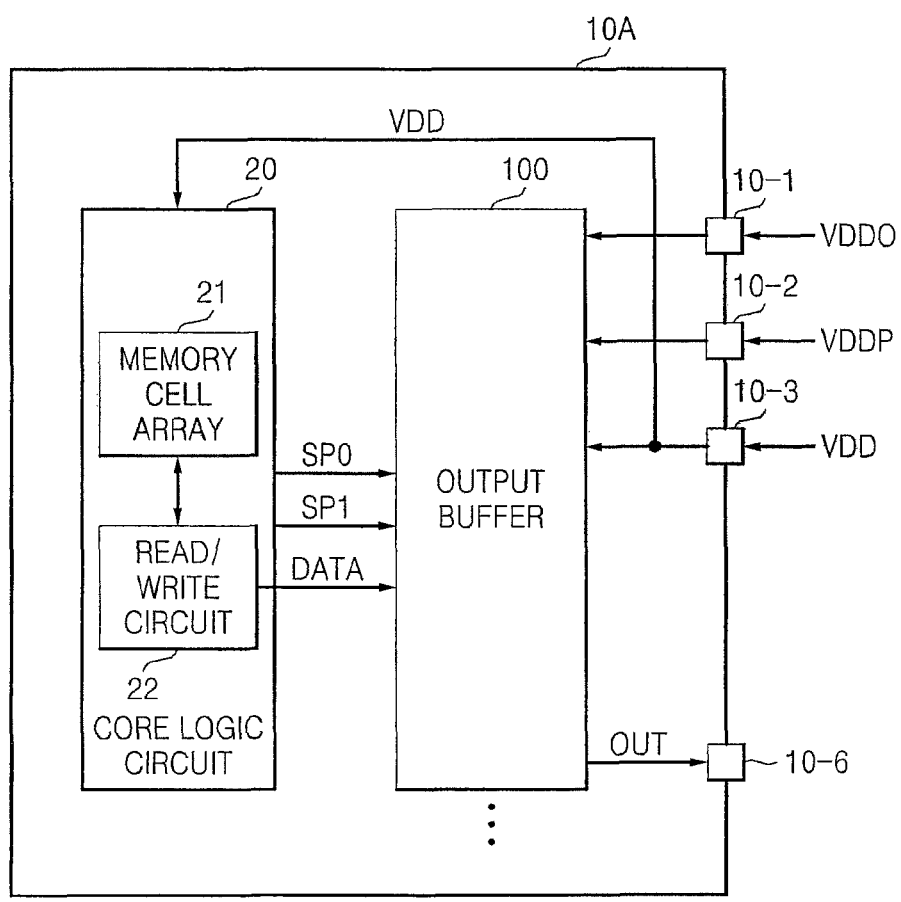
FIG. 1 is a block diagram of a semiconductor device including an output buffer according to some exemplary embodiments in accordance with principles of inventive concepts.

Exemplary embodiments in accordance with principles of inventive concepts will now be described more fully with reference to the accompanying drawings, in which exemplary embodiments are shown. Exemplary embodiments in accordance with principles of inventive concepts may, however, be embodied in many different forms and should not be construed as being limited to the embodiments set forth herein; rather, these embodiments are provided so that this disclosure will be thorough and complete, and will fully convey the concept of exemplary embodiments to those of ordinary skill in the art. In the drawings, the thicknesses of layers and regions may be exaggerated for clarity. Like reference numerals in the drawings denote like elements, and thus their description may not be repeated.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of exemplary embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of exemplary embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Exemplary embodiments in accordance with principles of inventive concepts are described herein with reference to cross-sectional illustrations that are schematic illustrations of idealized embodiments (and intermediate structures) of exemplary embodiments. As such, variations from the shapes of the illustrations as a result, for example, of manufacturing techniques and/or tolerances, are to be expected. Thus, exemplary embodiments in accordance with principles of inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of exemplary embodiments. Unless otherwise defined, all terms (including technical and scientific terms) used herein have the same meaning as commonly understood by one of ordinary skill in the art to which exemplary embodiments in accordance with principles of inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a block diagram of a semiconductor device 10A including an output buffer according to an exemplary embodiments in accordance with principles of inventive concepts. Semiconductor device 10A includes core logic circuit 22, output buffer 100 and a plurality of pads 10-1, 10-2, 10-3 and 10-6.

For clarity of the description, only single output buffer 100 that outputs 1-bit output data is illustrated in FIG. 1. However, a plurality of output buffers having the same structure as the output buffer 100 may be included in semiconductor device 10A to output a plurality of bits in parallel, for example.

Core logic circuit 20 includes a memory cell array 21 and read/write circuit 22. Core logic circuit 20 uses a voltage VDD, also referred to herein as a third voltage or, simply supply voltage VDD, supplied through the third pad 10-3 as an internal supply voltage.

Memory cell array 21 includes a plurality of memory cells which store data and a plurality of word lines and bit lines to access the memory cells.

The memory cells may be implemented as volatile or nonvolatile memory cells, for example. Volatile memory cells may be implemented as dynamic random access memory (DRAM), static RAM (SRAM), thyristor RAM (T-RAM) cells, zero-capacitor RAM (Z-RAM) or twin transistor RAM (TTRAM), for example.

Nonvolatile memory cells may be implemented as electrically erasable programmable read-only memory (EEPROM), flash memory, magnetic RAM (MRAM), spin-transfer torque MRAM, conductive bridging RAM (CBRAM), ferroelectric RAM (FRAM), phase-change RAM (PRAM) or resistive RAM, for example. Each nonvolatile memory cells may store one or more bits, or may, in other words, be capable of multi-level operation.

Read/write circuit 22 may refer to peripheral circuits necessary to read data stored in memory cell array 21 in a read operation, or to peripheral circuits necessary to write data to memory cell array 21 in a write operation. In an exemplary embodiment in accordance with principles of inventive concepts, during a read operation, read/write circuit 22 may send indication signals SP0 and SP1 indicating the direct current (DC) level of a first voltage VDDO (also referred to herein as first supply voltage VDDO), along with output data DATA, to output buffer 100. Read/write circuit 22 may generate indication signal SP0 and SP1, also referred to herein as level indication signals SP0 and SP1, or as VDDO supply indicators SPO and SP1.

Output buffer 100 buffers output data DATA received from core logic circuit 20 using first voltage VDDO, also referred to herein as first supply voltage VDDO, received through first pad 10-1, second voltage VDDP, also referred to herein as second supply voltage VDDP, received through second pad 10-2, third voltage VDD, also referred to herein as third supply voltage VDD, received through the third pad 10-3, and VDDO supply indication signals SP0 and SP1, and outputs buffered output data OUT through output pad 10-6.

In an exemplary embodiment in accordance with principles of inventive concepts, pads 10-1, 10-2, 10-3 and 10-6 may also be used to transmit a voltage and/or a signal.

For clarity of the description, it is assumed that a supply voltage of an output buffer (100A in FIG. 3A, 100B in FIG. 3B, 130C in FIG. 3C, 100A' in FIG. 5A, 100B' in FIG. 5B, or 100C' in FIG. 5C), that is, in an exemplary embodiment in accordance with principles of inventive concepts, first supply voltage VDDO has a value in a range from 1.8 V to 3.3 V (for example, VDDO is 1.8 V, 2.5 V, 3.0 V or 3.3 V), second supply voltage VDDP is 1.8 V, and third supply voltage VDD is 0.9 V.

The level, or value, of each of the VDDO indication signals SP0 and SP1, which will be described in greater detail in the discussion related to FIG. 7, may be set to indicate the DC level of first voltage VDDO.

Figure 2:
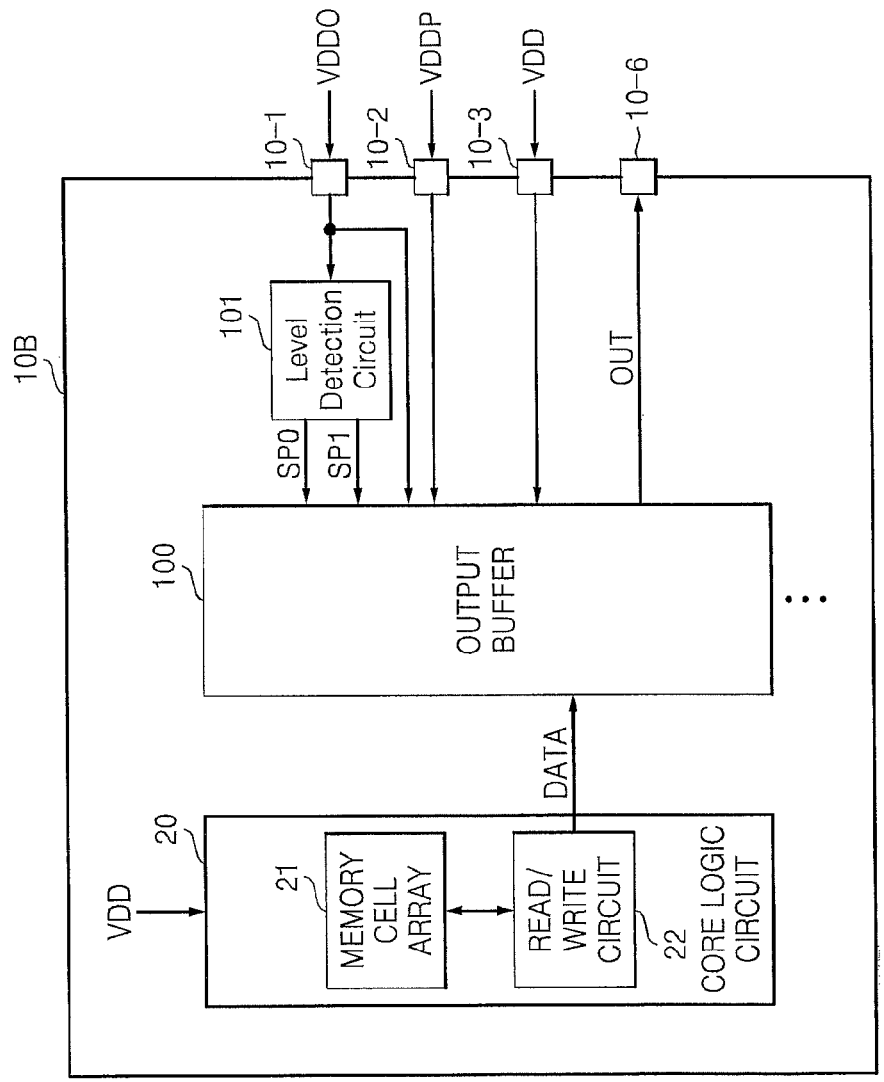
FIG. 2 is a block diagram of a semiconductor device including an output buffer according to other exemplary embodiments in accordance with principles of inventive concepts.

FIG. 2 is a block diagram of a semiconductor device 10B including output buffer 100 according to other exemplary embodiments in accordance with principles of inventive concepts. Semiconductor device 10B includes core logic circuit 20, output buffer 100, level detection circuit 101, and pads 10-1, 10-2, 10-3 and 10-6. Unlike semiconductor device 10A illustrated in FIG. 1, semiconductor device 10B includes level detection circuit 101, which automatically detects the DC level of first voltage VDDO.

Each of the semiconductor devices 10A and 10B may be implemented by a system on chip (SoC), which may be implemented as a part of a portable device or computing system, for example.

Level detection circuit 101 may detect the DC level of first voltage VDDO received through first pad 10-1 and output indication signals SP0 and SP1 based on the detection result. Level detection circuit 101 may automatically set the value of each of the indication signals SP0 and SP1 based on the DC level of first voltage VDDO, such as 1.8V, 2.5V, 3.0V, or 3.3.V, for example.

Output buffer 100 may buffer output data DATA received from core logic circuit 20 using first voltage VDDO received through first pad 10-1, second voltage VDDP received through second pad 10-2, third voltage VDD received through third pad 10-3 and indication signals SP0 and SP1 received from level detection circuit 101 and output buffered output data OUT through output pad 10-6.

FIG. 3A is a block diagram of the output buffer 100A corresponding to the output buffer 100 illustrated in FIG. 1 or 2 according to an exemplary embodiments in accordance with principles of inventive concepts. Output buffer 100A includes internal pre-driver logic circuit 110, first buffer 111, second buffer 112 and output buffer circuit 130A.

In an exemplary embodiment in accordance with principles of inventive concepts, internal pre-driver logic circuit 110 shifts the DC level of each of the indication signals SP0 and SP1 (while maintaining the value of the signals), and the level of output data DATA (again, while maintaining the value of the signals) and outputs level-shifted indication signals Ls_SP0 and Ls_SP1 and level-shifted data Ls_data. That is, in an exemplary embodiment in accordance with principles of inventive concepts, internal pre-driver logic circuit 110 may function as a level shifter. Accordingly, when signals SP0, SP1 and DATA have the level of third voltage VDD, signals Ls_SP0, Ls_SP1 and Ls_data may have the level of second voltage VDDP, for example. For example, when SP0 has a high logic value, it may be set to 0.9V in an embodiment in which VDD is 0.9V, but may be shifted to 1.8V by pre-driver logic circuit 110 in an embodiment in which VDDP is 1.8V, for example. In an exemplary embodiment in accordance with principles of inventive concepts, buffers 111 and 112 use second voltage VDDP (1.8V) as a supply voltage (or an operating voltage) and buffer level-shifted data Ls_data.

Output buffer circuit 130A includes sourcing control circuit 140, sourcing circuit 150, first sinking circuit 160, second sinking circuit 170 and sinking control circuit 180. In an exemplary embodiment in accordance with principles of inventive concepts, the term "sourcing" may signify pull-up and the term "sinking" may signify pull-down, for example.

Sourcing control circuit 140 may employ voltages VDD, VDDP and VDDO as supply voltages. Sourcing control circuit 140 may generate a first sourcing control signal Pg0 based on a combination of output data DATA (that is, output data of buffer 111) and indication signals Ls_SP0 and Ls_SP1 indicating the level, e.g., the DC level, of first voltage VDDO. In addition, sourcing control circuit 140 may generate a second sourcing control signal Pg_bias based on indication signals Ls_SP0 and Ls_SP1. That is, control signal Pg0 may be a combination of data levels and the value of supply voltage VDDO and bias control signal Pg_bias may be based simply on the value of supply voltage VDDO.

In an exemplary embodiment in accordance with principles of inventive concepts, sourcing circuit 150 supplies first voltage VDDO to an output terminal (or node) 151 in response to first sourcing control signal Pg0 and second sourcing control signal Pg_bias. For example, sourcing circuit 150 may include a first main driver P0 and a first bias driver P1 connected in series between a first voltage terminal (or node) and drive main driver P0 and bias driver P1 to connect output terminal 151 to VDDO, thereby "pulling up" output terminal 151 approximately to the level of VDDO. In an exemplary embodiment in accordance with principles of inventive concepts, first bias driver P1 may be used to reduce the voltage drop across terminals of first main driver P0.

In an exemplary embodiment in accordance with principles of inventive concepts, each of the drivers P0 and P1 may be implemented by a P-type metal oxide semiconductor (PMOS) transistor. In such an embodiment, the first sourcing control signal Pg0 may be applied to a gate of first PMOS transistor P0 and second sourcing control signal Pg_bias may be applied to a gate of second PMOS transistor P1. For example, second PMOS transistor P1 may be stacked on first PMOS transistor P0 in order to reduce hot carrier injection (HCI). Alternatively, each of the drivers P0 and P1 may be implemented by an N-type metal oxide semiconductor (NMOS) transistor.

In an exemplary embodiment in accordance with principles of inventive concepts, first sinking circuit 160 may apply a ground voltage VSS to output terminal 151 according to the value of data Ng received from second buffer 112. First sinking circuit 160 may include a second bias driver N0 and a second main driver N1 connected in series between output terminal 151 and a ground, for example.

Each of the drivers N0 and N1 may be implemented with an NMOS transistor. In such an embodiment, second voltage VDDP may be applied to a gate of first NMOS transistor N0 and data Ng output from second buffer 112 may be applied to a gate of second NMOS transistor N1.

Second sinking circuit 170 may apply ground voltage VSS to output terminal 151 according to the value of sinking control signal Ng1 received from sinking control circuit 180. Second sinking circuit 170 may include a third bias driver N2 and a third main driver N3 connected in series between output terminal 151 and the ground, for example.

Each of the drivers N2 and N3 may be implemented with an NMOS transistor. In such an embodiment, second voltage VDDP may be applied to a gate of third NMOS transistor N2 and sinking control signal Ng1 output from sinking control circuit 180 may be applied to a gate of fourth NMOS transistor N3.

In an exemplary embodiment in accordance with principles of inventive concepts, sinking control circuit 180 may generate sinking control signal Ng1 based on a selection signal Node_x related to indication signals Ls_SP0 and Ls_SP1 and data Ng received from the second buffer 112.

Selection signal Node_x related to indication signals Ls_SP0 and Ls_SP1 may be a signal among a plurality of selection signals generated as a result of decoding the indication signals Ls_SP0 and Ls_SP1, for example.

Second sinking circuit 170 and sinking control circuit 180 may operate in response to the level of first voltage VDDO to adjust the reliability, e.g., output timing and/or duty ratio, of buffered output data OUT output through pad 10-6.

Figure 3B:
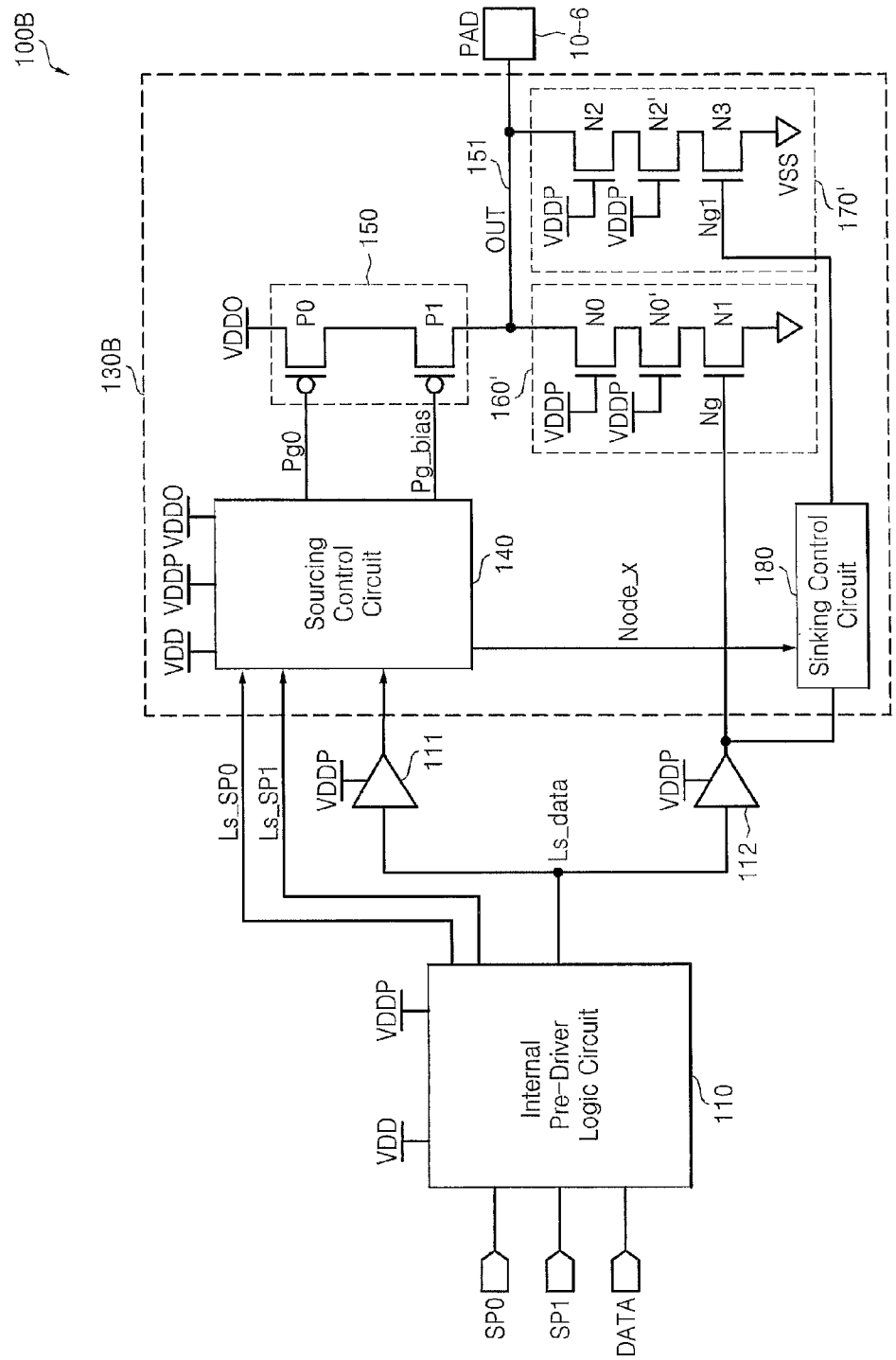
FIG. 3B is a block diagram of the output buffer illustrated in FIG. 1 or 2 according to other exemplary embodiments in accordance with principles of inventive concepts.

FIG. 3B is a block diagram of the output buffer 100B corresponding to output buffer 100 illustrated in FIG. 1 or 2 according to other exemplary embodiments in accordance with principles of inventive concepts. Output buffer circuit 130B illustrated in FIG. 3B substantially has the same structure as the output buffer circuit 130A illustrated in FIG. 3A except for a first sinking circuit 160' and a second sinking circuit 170'.

In an exemplary embodiment in accordance with principles of inventive concepts, first sinking circuit 160' may apply ground voltage VSS to output terminal 151 according to the value of data Ng received from second buffer 112. First sinking circuit 160' includes a plurality of drivers N0, N0' and N1 connected in series between output terminal 151 and ground, also referred to herein as common.

Each of the drivers N0, N0' and N1 may be implemented with an NMOS transistor. In such an embodiment, second voltage VDDP may be applied to a gate of each of the NMOS transistors N0 and N0' and data Ng output from second buffer 112 may be applied to the gate of second NMOS transistor N1.

Second sinking circuit 170' may apply ground voltage VSS to output terminal 151 according to the value of sinking control signal Ng1 received from sinking control circuit 180. Second sinking circuit 170' includes a plurality of drivers N2, N2' and N3 connected in series between output terminal 151 and ground, or common in.

Each of the drivers N2, N2' and N3 may be implemented with an NMOS transistor. If such an embodiment, second voltage VDDP may be applied to a gate of each of NMOS transistors N2 and N2' and sinking control signal Ng1 output from the sinking control circuit 180 may be applied to the gate of fourth NMOS transistor N3.

Figure 3C:
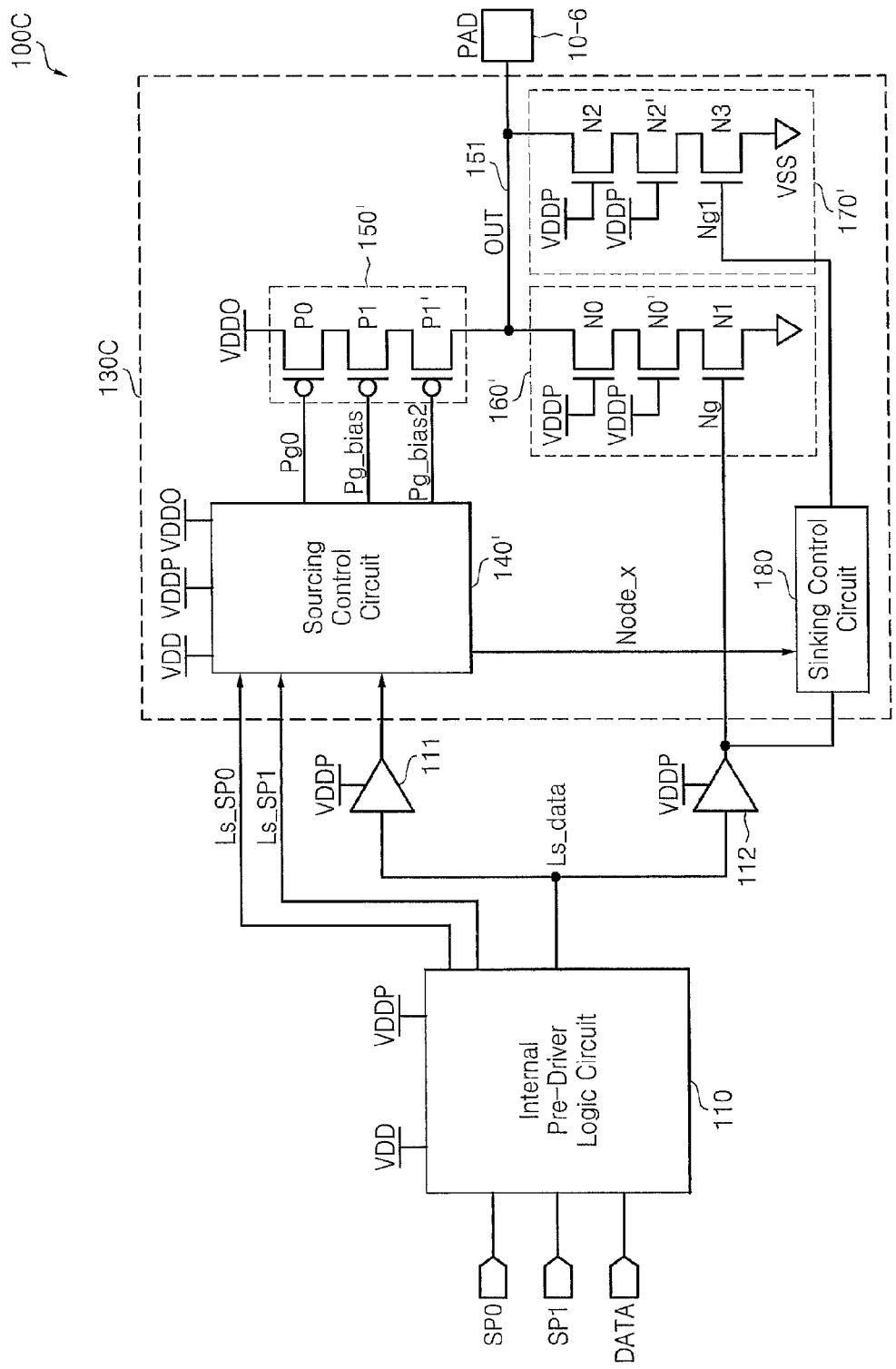
FIG. 3C is a block diagram of the output buffer illustrated in FIG. 1 or 2 according to further exemplary embodiments in accordance with principles of inventive concepts.

FIG. 3C is a block diagram of output buffer 100C corresponding to output buffer 100 illustrated in FIG. 1 or 2 according to further exemplary embodiments in accordance with principles of inventive concepts. Output buffer circuit 130C illustrated in FIG. 3C substantially has the same structure as output buffer circuit 130B illustrated in FIG. 3B, except for sourcing control circuit 140' and sourcing circuit 150'. Output buffers 100A, 100B and 100C may be different embodiments of output buffer 100 illustrated in FIG. 1 or 2.

Sourcing control circuit 140' generates first sourcing control signal Pg0 based on output data DATA (that is, an output data of the buffer 111) and indication signals Ls_SP0 and Ls_SP1 indicating the DC level of first voltage VDDO. Additionally, sourcing control circuit 140' generates second sourcing control signal Pg_bias and third sourcing control signal Pg_bias2, based on indication signals Ls_SP0 and Ls_SP1.

In an exemplary embodiment in accordance with principles of inventive concepts, sourcing circuit 150' applies first voltage VDDO to output terminal 151 in response to sourcing control signals Pg0, Pg_bias and Pg_bais2. Sourcing circuit 150' includes a plurality of drivers P0, P1 and P1' connected in series between first voltage terminal for the supply of first voltage VDDO and output terminal 151.

Each of the drivers P0, P1 and P1' may be implemented with a PMOS transistor, for example. In such an embodiment, first sourcing control signal Pg0 may be applied to the gate of first PMOS transistor P0, second sourcing control signal Pg_bias may be applied to the gate of second PMOS transistor P1, and third sourcing control signal Pg_bias2 may be applied to a gate of third PMOS transistor P1'. In an exemplary embodiment in accordance with principles of inventive concepts, sourcing control signals Pg_bias and Pg_bias2 may be same signal. In an exemplary embodiment in accordance with principles of inventive concepts, each of the drivers P0, P1 and P1' may be implemented with an NMOS transistor, for example.

Figure 4:
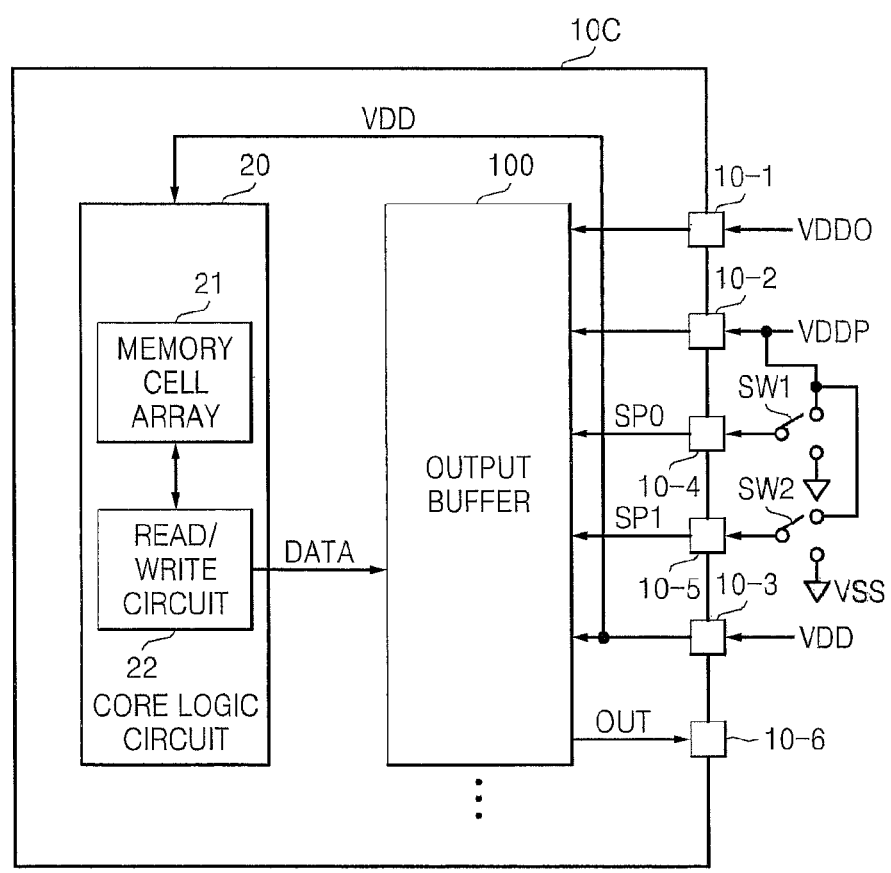
FIG. 4 is a block diagram of a semiconductor device including an output buffer according to further exemplary embodiments in accordance with principles of inventive concepts.

FIG. 4 is a block diagram of a semiconductor device 10C including output buffer 100 according to further exemplary embodiments in accordance with principles of inventive concepts. Referring to FIGS. 1 and 4, semiconductor device 10C further includes a plurality of pads 10-4 and 10-5 to receive indication signals SP0 and SP1. In such an embodiment, core logic circuit 20 transmits output data DATA to output buffer 100.

The values of respective indication signals SP0 and SP1 indicating the DC level of first voltage VDDO may be set using switches SW1 and SW2, respectively. For example, when first switch SW1, connected to the fourth pad 10-4, is connected to a line transmitting second voltage VDDP, first indication signal SP0 may be at logic 1, or a high value. When first switch SW1 is connected to ground, or common, first indication signal SP0 may be at logic 0, or a low value. When second switch SW2, connected to the fifth pad 10-5, is connected to a line transmitting second voltage VDDP, second indication signal SP1 may be at logic 1, or a high value. When second switch SW2 is connected to ground, second indication signal SP1 may be at logic 0, or a low value.

Each of the switches SW1 and SW2 may be implemented with a fuse, an antifuse or an efuse, for example. Accordingly, the value of each of the indication signals SP0 and SP1 may be manually set using a fuse, antifuse or efuse. For example, the values of indication signals SP0 and SP1 may be set by a manufacturer so that they cannot be changed after the manufacturing of semiconductor device 10C.

Figure 5A:
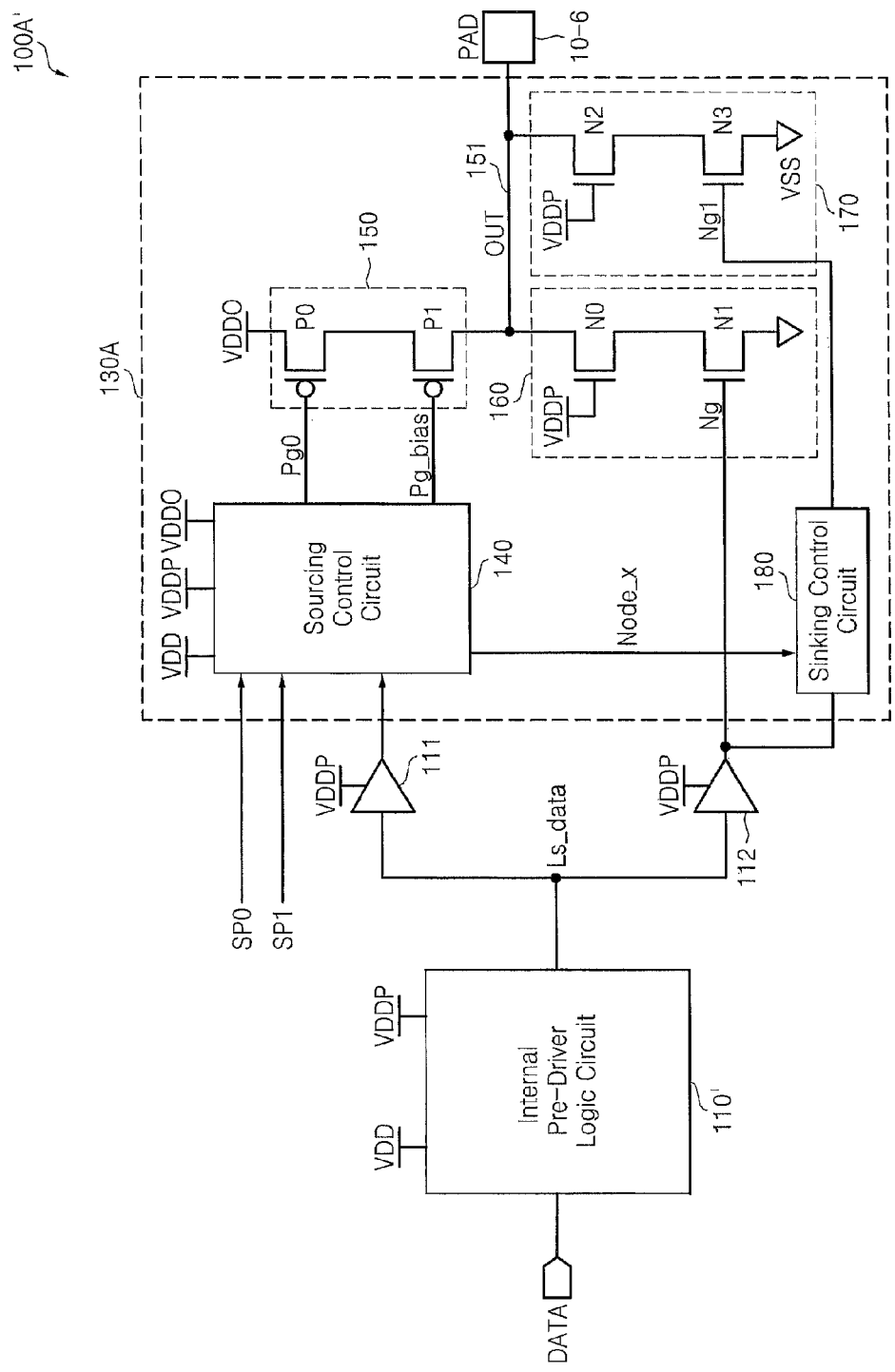
FIG. 5A is a block diagram of the output buffer illustrated in FIG. 4 according to some exemplary embodiments in accordance with principles of inventive concepts.

FIG. 5A is a block diagram of output buffer 100A' corresponding to the output buffer 100 illustrated in FIG. 4 according to an exemplary embodiments in accordance with principles of inventive concepts. Referring to FIGS. 3A, 4 and 5A, the level of output data DATA only is shifted by internal pre-driver logic circuit 110' and indication signals SP0 and SP1 are directly input to sourcing control circuit 140. That is, output buffer 100A' illustrated in FIG. 5A may have substantially the same structure as output buffer 100A illustrated in FIG. 3A, except for internal pre-driver logic circuit 110'.

Figure 5B:
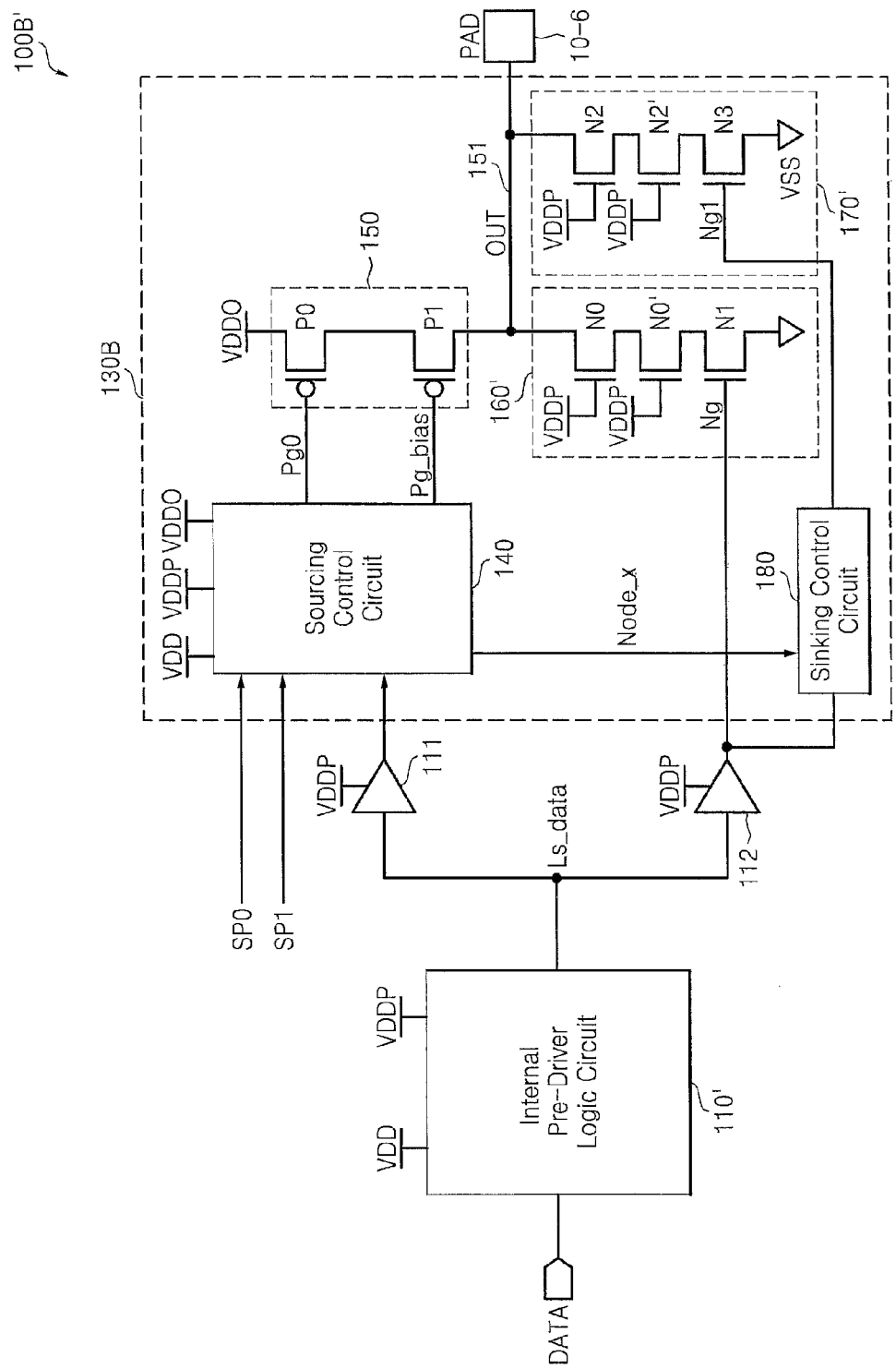
FIG. 5B is a block diagram of the output buffer illustrated in FIG. 4 according to other exemplary embodiments in accordance with principles of inventive concepts.

FIG. 5B is a block diagram of the output buffer 100B' corresponding to the output buffer 100 illustrated in FIG. 4 according to other exemplary embodiments in accordance with principles of inventive concepts. Referring to FIGS. 3B, 4 and 5B, the level of output data DATA may be shifted by internal pre-driver logic circuit 110' and indication signals SP0 and SP1 may be directly input to sourcing control circuit 140. That is, output buffer 100B' illustrated in FIG. 5B may have substantially the same structure as output buffer 100B illustrated in FIG. 3B except for internal pre-driver logic circuit 110'.

Figure 5C:
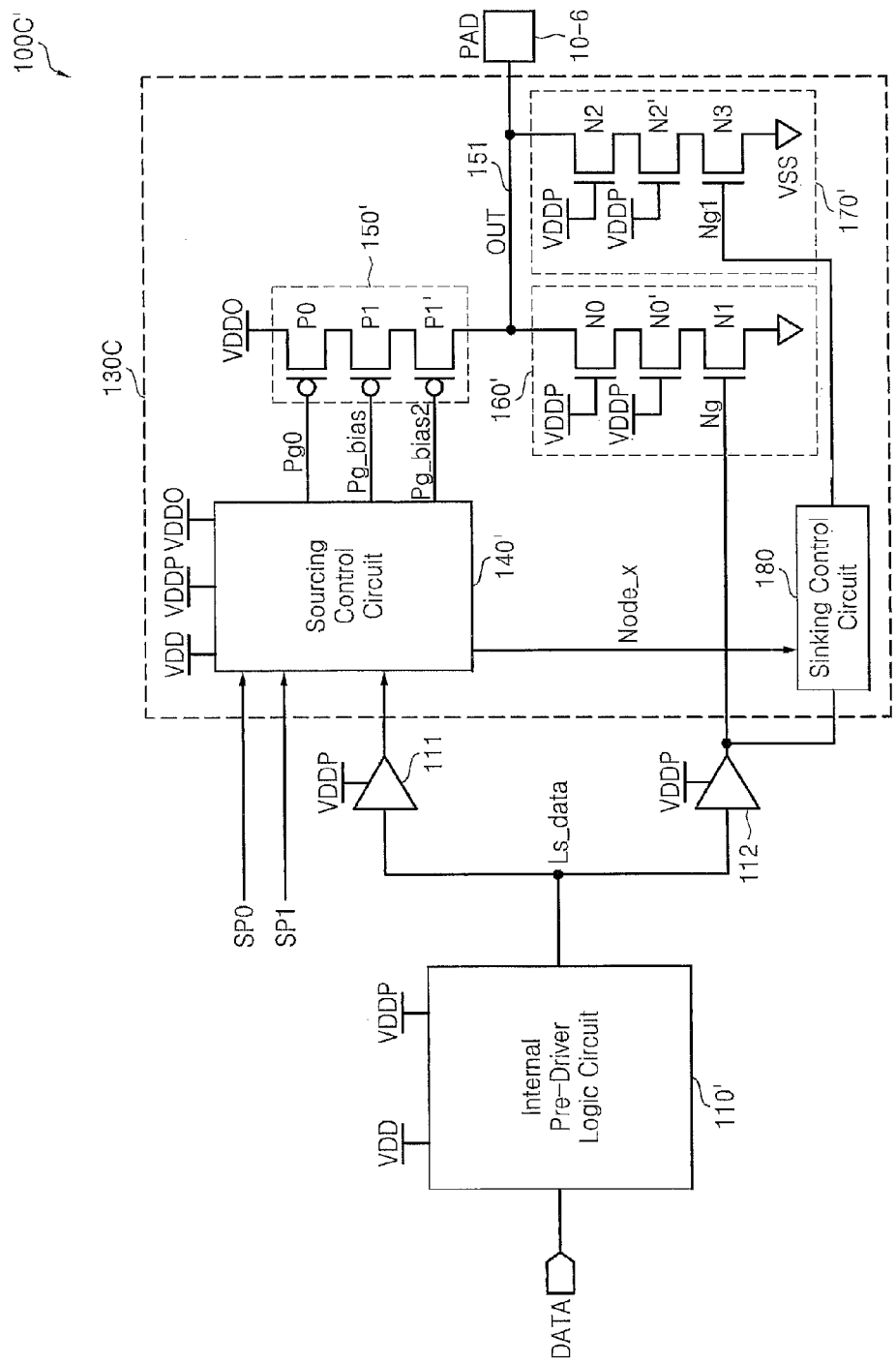
FIG. 5C is a block diagram of the output buffer illustrated in FIG. 4 according to further exemplary embodiments in accordance with principles of inventive concepts.

FIG. 5C is a block diagram of output buffer 100C' corresponding to output buffer 100 illustrated in FIG. 4 according to an exemplary embodiment in accordance with principles of inventive concepts. Referring to FIGS. 3C, 4 and 5C, the level of output data DATA only may be shifted by internal pre-driver logic circuit 110' and indication signals SP0 and SP1 may be directly input to sourcing control circuit 140. That is, output buffer 100C' illustrated in FIG. 5C may have substantially the same structure as output buffer 100C illustrated in FIG. 3C except for internal pre-driver logic circuit 110'.

Figure 6A:
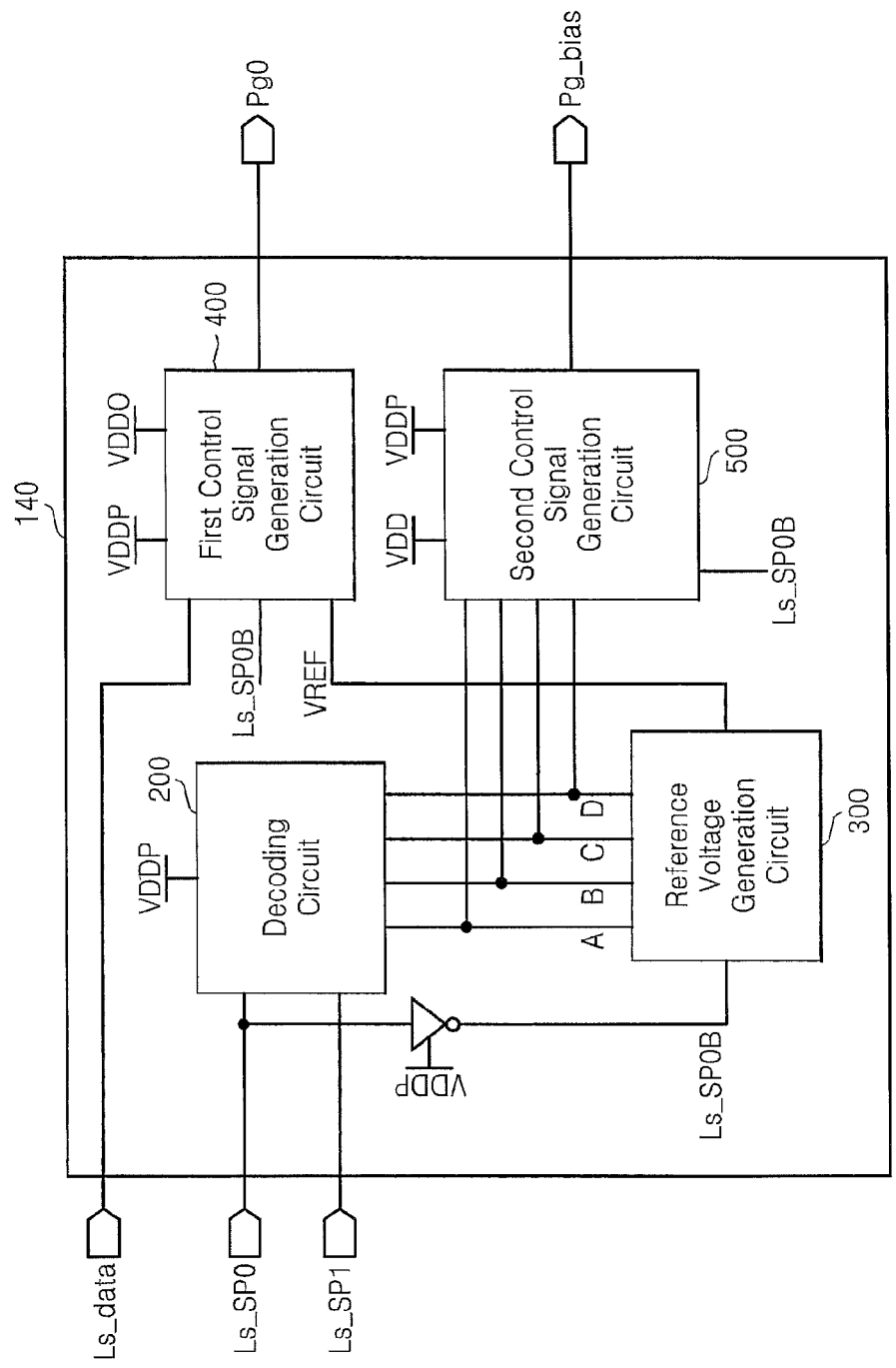
FIG. 6A is a block diagram of a sourcing control circuit illustrated in FIG. 3A, 3B, 5A or 5B.

FIG. 6A is a block diagram of an exemplary embodiment of sourcing control circuit 140 in accordance with principles of inventive concepts illustrated in FIG. 3A, 3B, 5A or 5B. For clarity of description, indication signals SP0 and SP1 and level-shifted indication signals Ls_SP0 and Ls_SP1 are generically named "indication signals" and output data DATA and level-shifted data Ls_data are generically named "output data".

Sourcing control circuit 140 includes decoding circuit 200, reference voltage generation circuit 300, first control signal generation circuit 400, and second control signal generation circuit 500. In an exemplary embodiment in accordance with principles of inventive concepts, decoding circuit 200 decodes indication signals Ls_SP0 and Ls_SP1, which indicate the DC level of first voltage VDDO, and generates selection signals A, B, C and D as a decoding result.

Figure 6B:
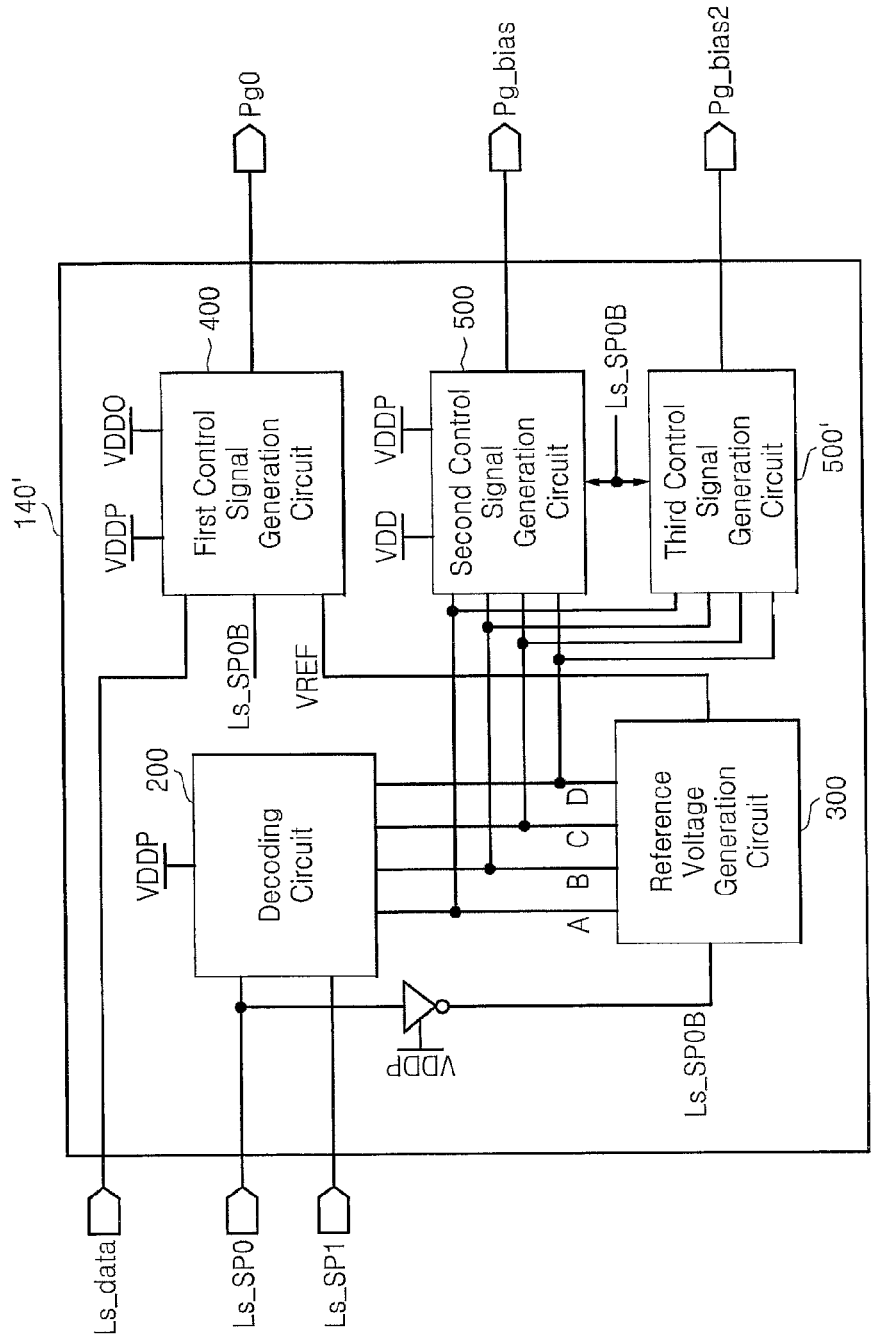
FIG. 6B is a block diagram of a sourcing control circuit illustrated in FIG. 3C or 5C.
Figure 7:
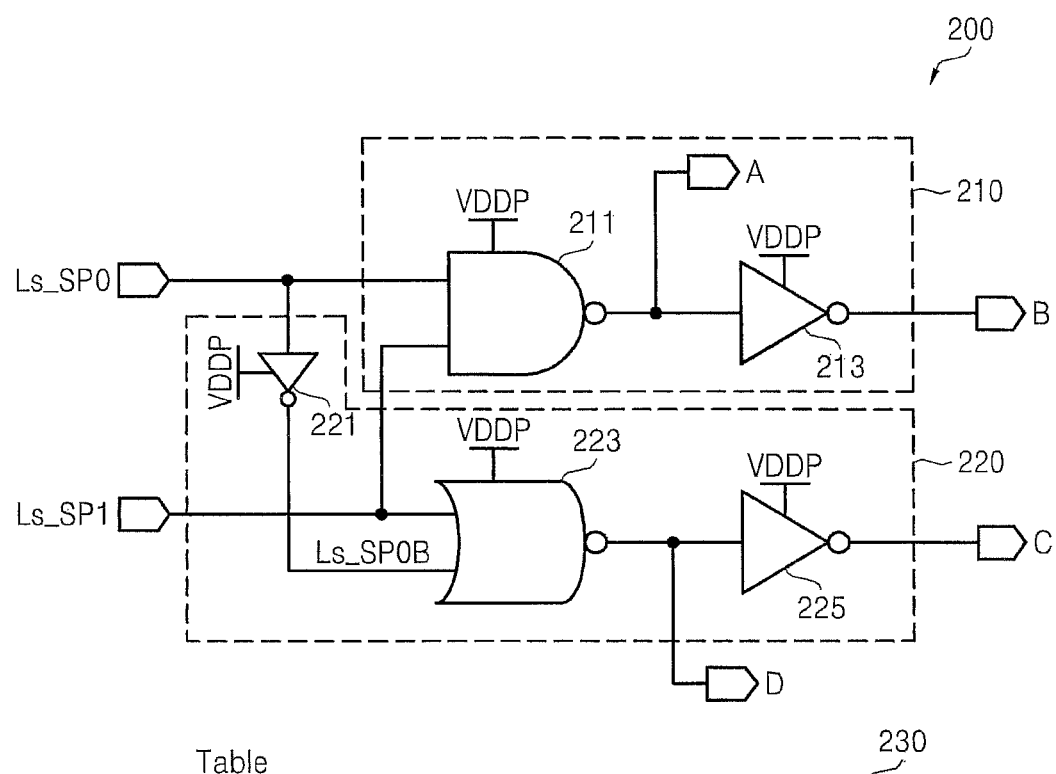
FIG. 7 is a circuit diagram of a decoding circuit illustrated in FIG. 6A or 6B.

FIG. 7 is a circuit diagram of an exemplary embodiment in accordance with principles of inventive concepts of decoding circuit 200 illustrated in FIG. 6A or 6B. Referring to FIG. 7, decoding circuit 200 includes first selection signal generation circuit 210 and second selection signal generation circuit 220.

In an exemplary embodiment in accordance with principles of inventive concepts first and second selection signal generations circuits 210, 220 respectively generate first selection signals A, B and second selection signals B, C, responsive to first and second indication signals Ls_SP0 and Ls_SP1.

First selection signal generation circuit 210 includes a NAND gate 211 and a first inverter 213. NAND gate 211, which uses second voltage VDDP and ground voltage VSS as operating voltages, performs a NAND operation on first and second indication signals Ls_SP0 and Ls_SP1 to generate selection signal A. First inverter 213, which uses second voltage VDDP and ground voltage VSS as operating voltages, inverts selection signal A received from the NAND gate 211 thereby generating selection signal B.

Second selection signal generation circuit 220 includes a second inverter 221, a NOR gate 223 and a third inverter 225. Second inverter 221, which uses second voltage VDDP and ground voltage VSS as operating voltages, inverts first indication signal Ls_SP0 and generates inverted first indication signal Ls_SP0B. NOR gate 223, which uses second voltage VDDP and ground voltage VSS as operating voltages, performs a NOR operation on inverted first indication signal Ls_SP0B and second indication signal Ls_SP1 and to thereby generate selection signal D. Third inverter 225, which uses second voltage VDDP and ground voltage VSS as operating voltages, inverts selection signal D received from NOR gate 223 thereby generating selection signal C.

In an exemplary embodiment in accordance with principles of inventive concepts when the DC level of first voltage VDDO is a first level, V1, first indication signal SP0 may be set to logic 0 and second indication signal SP1 may be set to logic 0 or logic 1. In such a situation, second indication signal SP1 is don't care (X).

When the DC level of first voltage VDDO is a second level, V2, first indication signal SP0 is set to logic 1 and second indication signal SP1 may be set to logic 0. When the DC level of first voltage VDDO is a third level, V3, first indication signal SP0 is set to logic 1 and second indication signal SP1 may be set to logic 1. The first level V1 may be 1.8 V, the second level V2 may be 2.5 or 3.0 V, and the third level V3 may be 3.3 V, for example.

Selection signals A, B, C and D generated by first and second selection signal generation circuits 210 and 220 based on the logic, levels, or, simply, values, of indication signals SP0 and SP1 are tabulated in function table 230. One signal, e.g., C, among the selection signals A, B, C and D is sent to sinking control circuit 180, that is, Node_x=C.

Reference voltage generation circuit 300 (shown in FIGS. 6A and 6B, for example), which may be referred to as a self-gate bias tracking circuit, outputs one voltage among a plurality of internal voltages as a reference voltage VREF in response to one of the indication signals, e.g., the inverted first indication signal Ls_SP0B, and selection signals A, B, C and D.

Figure 8:
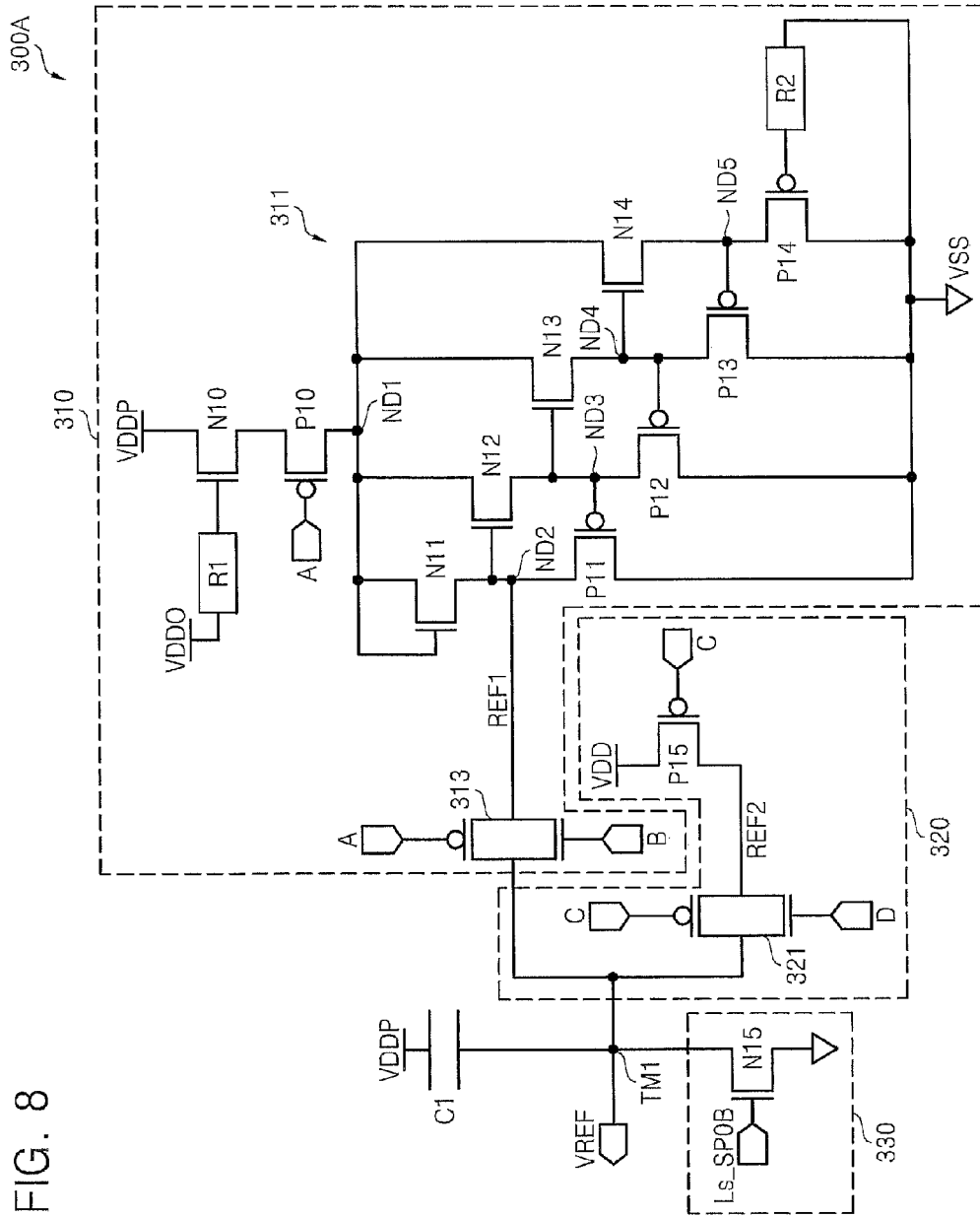
FIG. 8 is a circuit diagram of a reference voltage generation circuit illustrated in FIG. 6A or 6B according to some exemplary embodiments in accordance with principles of inventive concepts.

FIG. 8 is a circuit diagram of a reference voltage generation circuit 300A corresponding to the reference voltage generation circuit 300 illustrated in FIG. 6A or 6B according to an exemplary embodiments in accordance with principles of inventive concepts. When the DC level of first voltage VDDO is third level V3, reference voltage generation circuit 300A outputs an internal voltage REF1 related to second voltage VDDP as reference voltage VREF in response to first selection signals A and B.

When the DC level of first voltage VDDO is the second level V2, reference voltage generation circuit 300A outputs an internal voltage REF2 related to third voltage VDD as reference voltage VREF in response to second selection signals C and D. When the DC level of first voltage VDDO is the first level V1, reference voltage generation circuit 300A outputs the ground voltage VSS as reference voltage VREF in response to inverted first indication signal Ls_SP0B.

In an exemplary embodiment in accordance with principles of inventive concepts, reference voltage generation circuit 300A includes a first voltage generation circuit 310, a second voltage generation circuit 320, a third voltage generation circuit 330 and a capacitor C1.

First voltage generation circuit 310 outputs internal voltage REF1 related to second voltage VDDP as reference voltage VREF in response to first selection signals A and B. First voltage generation circuit 310 includes a first voltage generator 311 and a first transmission circuit 313.

In an exemplary embodiment in accordance with principles of inventive concepts, first voltage generator 311 generates internal voltage REF1 related to second voltage VDDP and first transmission circuit 313 transmits internal voltage REF1 to output terminal TM1 in response to first selection signals A and B. First voltage generator 311 includes transistors N10 and P10 connected in series between second voltage terminal for the supply of the second voltage VDDP and node ND1.

A gate of NMOS transistor N10 is connected to first voltage terminal (or node) for the supply of first voltage VDDO through resistor R1, and therefore, a bias voltage generated through resistor R1 may be applied to the gate of NMOS transistor N10. Accordingly, NMOS transistor N10 may be maintained in a turn-on state.

Selection signal A may be applied to a gate of PMOS transistor P10. When the selection signal A is logic 0, that is, when first voltage VDDO is at third level V3, e.g., 3.3 V, as shown in table 230 illustrated in FIG. 7, first voltage generator 311, for example PMOS transistor P10 supplies a current related to second voltage VDDP to the node ND1.

NMOS transistors N11, N12, N13 and N14 provide current, or charges, to nodes ND2, ND3, ND4 and ND5, respectively. PMOS transistors P11, P12, P13 and P14 discharge the current or charge of nodes ND2, ND3, ND4 and ND5, respectively, in order to maintain the voltage of each of the nodes ND2, ND3, ND4 and ND5 constant.

A gate of PMOS transistor P14 is connected to ground through resistor R2. Resistor R2 may provide a bias voltage to the gate of PMOS transistor P14. Accordingly, the PMOS transistor P14 may be maintained in the turn-on state.

When second voltage VDDP is applied to node ND1 through NMOS transistor N10 in response to the selection signal A of logic 0, voltage REF1 of node ND2 becomes (VDDP−Vth_N11) in response to a threshold voltage Vth_N11 of NMOS transistor N11. At this time, PMOS transistor P11 is weakly turned on in response to a voltage applied to node ND3 through NMOS transistor N12. Accordingly, PMOS transistor P11 prevents internal voltage REF1 from increasing by second voltage VDDP.

Because leakage current flows in PMOS transistor P11, voltage REF1 of node ND2 is slightly lower than (VDDP−Vth_N11). At this time, internal voltage REF1 is output as reference voltage VREF, and therefore, reference voltage VREF applied to first control signal generation circuit 400 illustrated in FIG. 10 maintains the reliability of gate oxide of PMOS transistors P21, P22, P23 and P24. Accordingly, an operating point of the first control signal generation circuit 400, which functions as a high-voltage-tolerant level-shifter, may be reliably maintained.

First transmission circuit 313 may transmit internal voltage REF1 to output terminal TM1 as reference voltage VREF in response to first selection signals A and B. The first transmission circuit 313 may be implemented with a transmission gate, for example.

In an exemplary embodiment in accordance with principles of inventive concepts, when the DC level of first voltage VDDO is the second level V2 (2.5 V in an exemplary embodiment), second voltage generation circuit 320 outputs internal voltage REF2 related to third voltage VDD as reference voltage VREF in response to second selection signals C and D.

Second voltage generation circuit 320 includes a second voltage generator P15 which outputs third voltage VDD in response to selection signal C, and second transmission circuit 321, which transmits internal voltage REF2 received from second voltage generator P15 to output terminal TM1 as reference voltage VREF in response to second selection signals C and D.

Second voltage generator P15 may be implemented with a PMOS transistor and second transmission circuit 321 may be implemented with a transmission gate.

In an exemplary embodiment in accordance with principles of inventive concepts, when the DC level of first voltage VDDO is first level V1, third voltage generation circuit 330 may output ground voltage VSS as reference voltage VREF in response to inverted first indication signal Ls_SP0B. Third voltage generation circuit 330 may be implemented with an NMOS transistor. Capacitor C1 may be connected between the second voltage terminal for the supply of the second voltage VDDP, and the output terminal TM1, and may function to stabilize the level of reference voltage VREF output through output terminal (or node) TM1.

Figure 9:
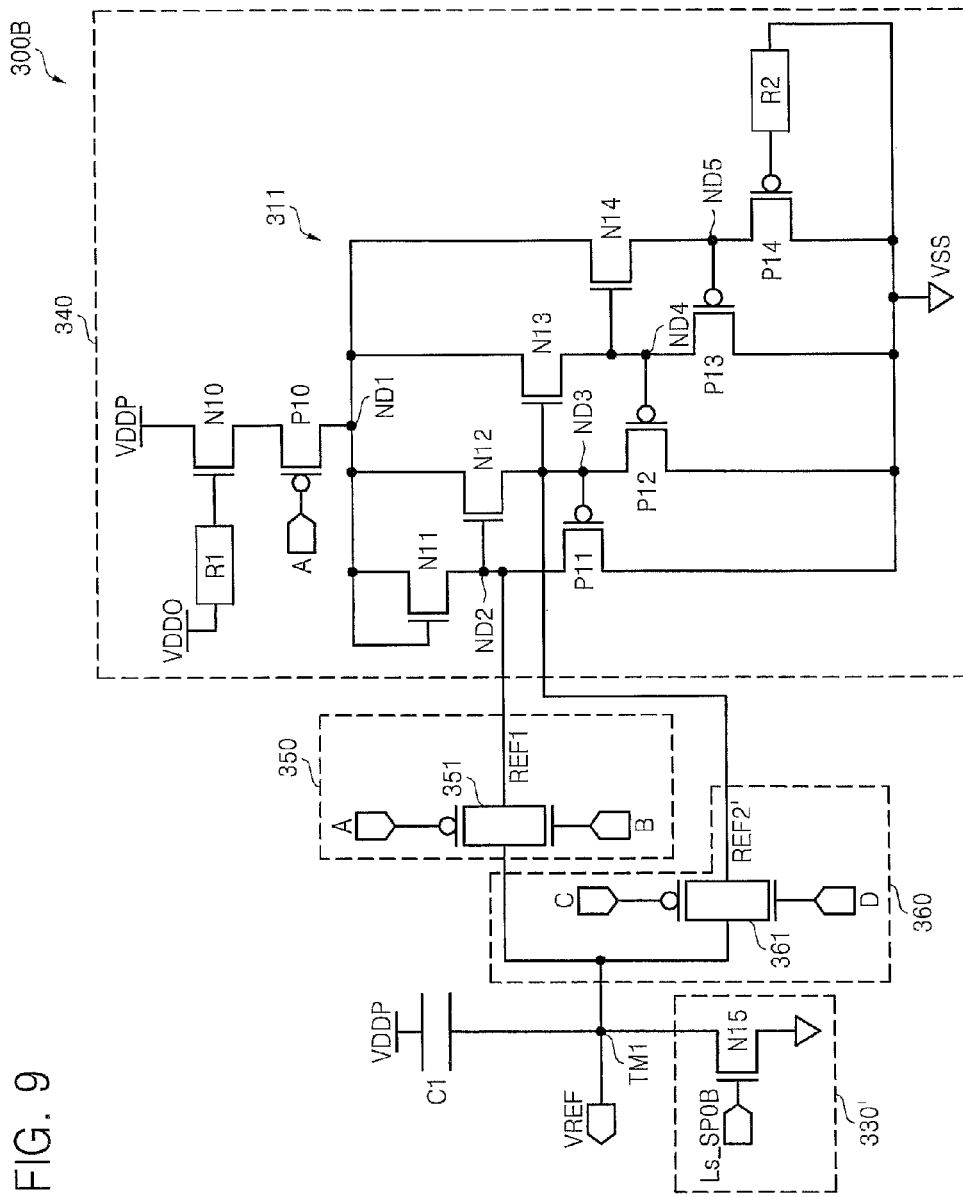
FIG. 9 is a circuit diagram of the reference voltage generation circuit illustrated in FIG. 6A or 6B according to other exemplary embodiments in accordance with principles of inventive concepts.

FIG. 9 is a circuit diagram of a reference voltage generation circuit 300B corresponding to the reference voltage generation circuit 300 illustrated in FIG. 6A or 6B according to other exemplary embodiments in accordance with principles of inventive concepts.

Reference voltage generation circuit 300B includes first voltage generation circuit 340, first transmission circuit 350, second transmission circuit 360 and second voltage generation circuit 330'. First voltage generation circuit 340 may generate internal voltages REF1 and REF2', related to second voltage VDDP, based on first voltage VDDO and one signal, for example, A, among first selection signals A and B.

First voltage generation circuit 340 illustrated in FIG. 9 may have substantially the same structure as first voltage generator 311 illustrated in FIG. 8. However, first voltage generation circuit 340 illustrated in FIG. 9 generates a voltage of node ND2 and a voltage of node ND3 as internal voltages REF1 and REF2', respectively.

First transmission circuit 350 transmits internal voltage REF1 to output terminal TM1 in response to first selection signals A and B. For example, when the DC level of first voltage VDDO is the third level V3, first transmission circuit 350 transmits internal voltage REF1 to output terminal TM1 in response to first selection signals A and B. Second transmission circuit 360 transmits internal voltage REF2' to output terminal TM1 in response to second selection signals C and D. For example, when the DC level of first voltage VDDO is second level V2, (3.0 V in an exemplary embodiment), second transmission circuit 360 transmits internal voltage REF2' to output terminal TM1 in response to second selection signals C and D.

The structure of an exemplary embodiment in accordance with principles of inventive concepts of second voltage generation circuit 330' illustrated in FIG. 9 is substantially the same as that of third voltage generation circuit 330 illustrated in FIG. 8. Accordingly, when the DC level of first voltage VDDO is the first level V1, second voltage generation circuit 330' transmits ground voltage VSS to output terminal TM1 as reference voltage VREF in response to inverted first indication signal Ls_SP0B.

In an exemplary embodiment in accordance with principles of inventive concepts, capacitor C1 is connected between second voltage terminal for the supply of second voltage VDDP, and output terminal TM1. Capacitor C1 may function to stabilize the level of reference voltage VREF output through output terminal TM1.

As described above, reference voltage generation circuit 300B outputs internal voltage REF1 in response to first selection signals A and B when the DC level of first voltage VDDO is the third level V3; outputs internal voltage REF2' in response to second selection signals C and D when the DC level of first voltage VDDO is the second level V2; and outputs ground voltage VSS in response to inverted first indication signal Ls_SP0B when the DC level of first voltage VDDO is the first level V1.

First control signal generation circuit 400 generates first sourcing control signal Pg0, which may take on the value of first voltage VDDO or reference voltage VREF, based on output data Ls_data, inverted first indication signal Ls_SP0B, and reference voltage VREF. That is, first control signal generation circuit 400 generates first sourcing control signal Pg0 based on the value of output data Ls_data, indication signals SP0 and SP1, and reference voltage VREF.

Figure 10:
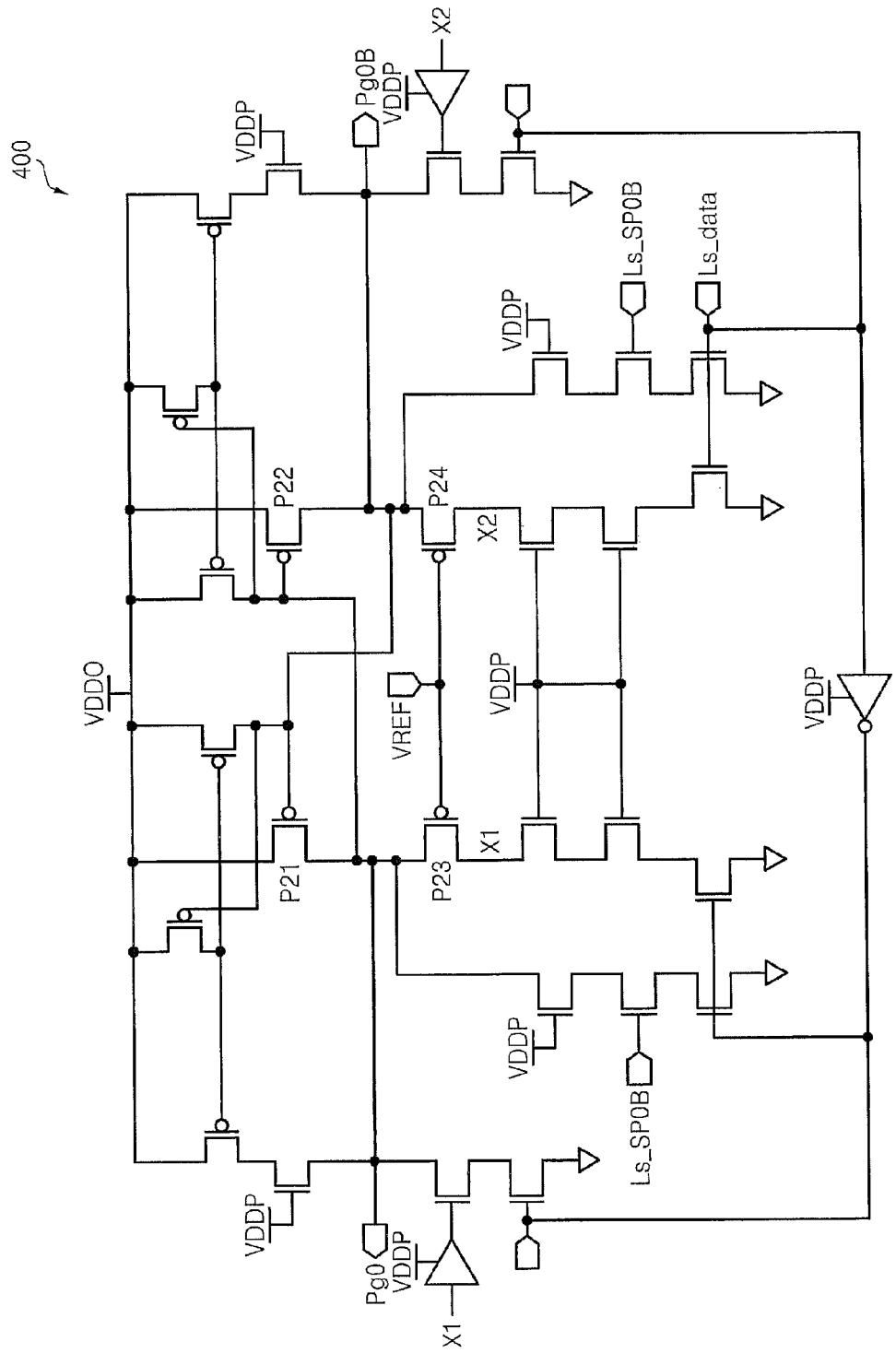
FIG. 10 is a circuit diagram of a first control signal generation circuit illustrated in FIG. 6A or 6B.

An exemplary embodiment in accordance with principles of inventive concepts of first control signal generation circuit 400, such as illustrated in FIGS. 6A and 6B is depicted in the circuit diagram of FIG. 10. First control signal generation circuit 400 adjusts the level of first sourcing control signal Pg0 according to the level of reference voltage VREF.

First sourcing control signal Pg0 may take on the value of first voltage VDDO or reference voltage VREF. More particularly, first sourcing control signal Pg0 may swing between first voltage VDDO and (VREF+Vth_P23) where Vth_P23 indicates the threshold voltage of PMOS transistor P23. Sourcing control signals Pg0 and Pg0B are differential signals.

Second control signal generation circuit 500 may output one voltage among: an internal voltage related to second voltage VDDP; an internal voltage related to third voltage VDD; and ground voltage VSS, as second sourcing control signal Pg_bias in response to inverted first indication signal Ls_SP0B and selection signals A, B, C and D, for example.

Figure 11:
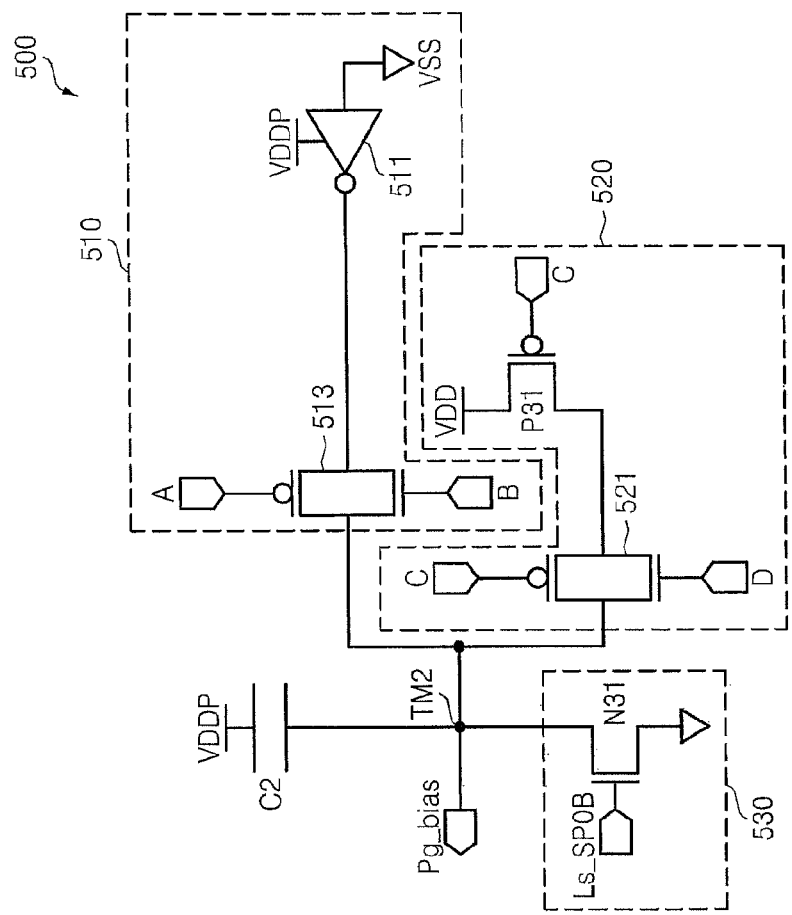
FIG. 11 is a circuit diagram of a second control signal generation circuit illustrated in FIG. 6A or 6B according to some exemplary embodiments in accordance with principles of inventive concepts.

FIG. 11 is a circuit diagram of second control signal generation circuit 500 illustrated in FIG. 6A or 6B, according to an exemplary embodiments in accordance with principles of inventive concepts. Second control signal generation circuit 500 outputs internal voltage related to second voltage VDDP in response to first selection signals A and B when the DC level of first voltage VDDO is the third level V3; outputs an internal voltage related to third voltage VDD in response to second selection signals C and D when the DC level of first voltage VDDO is second level V2; and outputs ground voltage VSS in response to inverted first indication signal Ls_SP0B when the DC level of first voltage VDDO is first level V1.

Second control signal generation circuit 500 includes first transmission circuit 510, second transmission circuit 520, third transmission circuit 530 and capacitor C2.

First transmission circuit 510 outputs an internal voltage related to second voltage VDDP to output terminal TM2 in response to first selection signals A and B. First transmission circuit 510 includes first voltage generator 511 and first transmitter 513. First voltage generator 511 outputs an internal voltage related to second voltage VDDP and first transmitter 513 transmits an internal voltage received from first voltage generator 511 to output terminal TM2 in response to first selection signals A and B. First voltage generator 511 may be implemented with an inverter, for example. Because an input terminal of inverter 511 is connected to ground, inverter 511 may output an internal voltage related to second voltage VDDP. Second transmission circuit 520 outputs an internal voltage related to third voltage VDD to output terminal TM2 in response to second selection signals C and D.

Second transmission circuit 520 includes second voltage generator P31 and second transmitter 521. Second voltage generator P31 outputs an internal voltage related to second voltage VDDP in response to selection signal C. Second voltage generator P31 may be implemented with a PMOS transistor, for example. Second transmitter 521 transmits an internal voltage related to third voltage VDD to output terminal TM2 in response to second selection signals C and D.

Third transmission circuit 530 outputs ground voltage VSS to output terminal TM2 in response to inverted first indication signal Ls_SP0B. Third transmission circuit 530 may be implemented with a PMOS transistor, for example. Capacitor C2 is connected between the second voltage terminal for the supply of second voltage VDDP and output terminal TM2. Capacitor C2 may function to stabilize the level of second sourcing control signal Pg_bias output through output terminal TM2.

Figure 12:
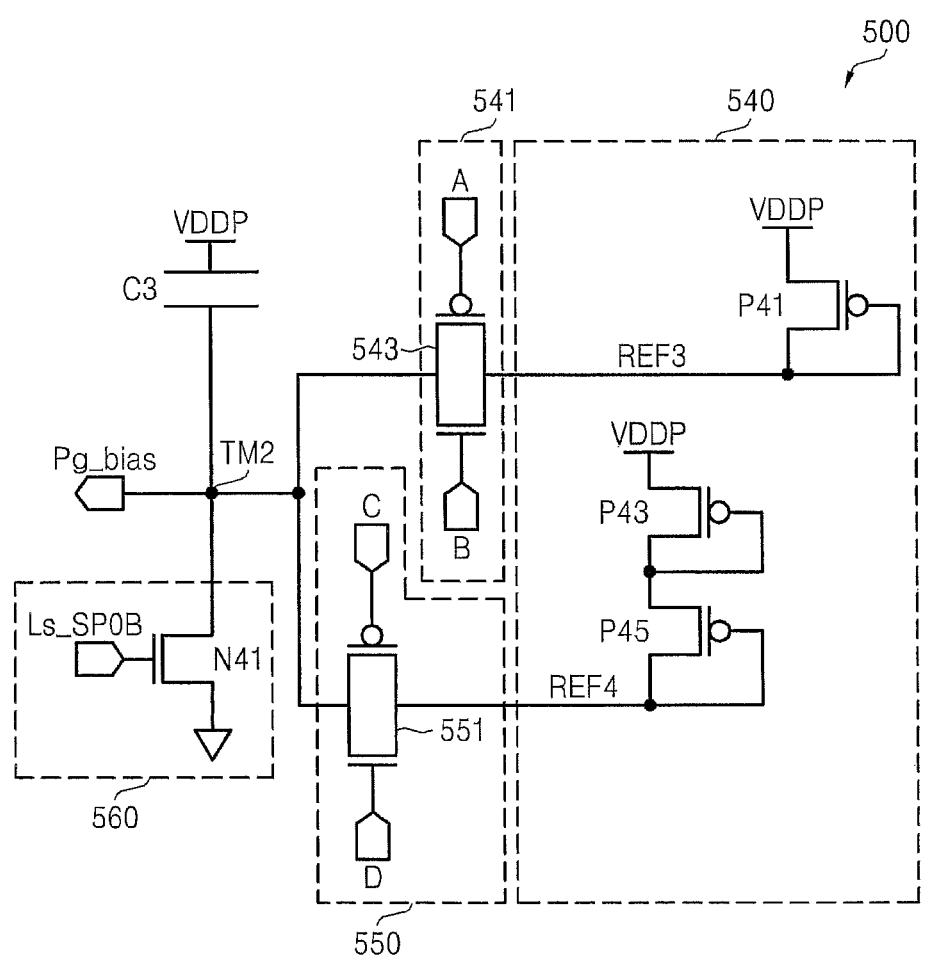
FIG. 12 is a circuit diagram of the second control signal generation circuit illustrated in FIG. 6A or 6B according to other exemplary embodiments in accordance with principles of inventive concepts.

FIG. 12 is a circuit diagram of second control signal generation circuit 500 illustrated in FIG. 6A or 6B according to other exemplary embodiments in accordance with principles of inventive concepts. Second control signal generation circuit 500 outputs an internal voltage REF3 in response to first selection signals A and B when the DC level of first voltage VDDO is third level V3, and outputs an internal voltage REF4 in response to second selection signals C and D when the DC level of first voltage VDDO is the second level V2. Internal voltage REF4 may be lower than internal voltage REF3, for example.

Second control signal generation circuit 500 outputs ground voltage VSS in response to inverted first indication signal Ls_SP0B when the DC level of first voltage VDDO is first level V1. Second control signal generation circuit 500 includes voltage generation circuit 540, first transmission circuit 541, second transmission circuit 550, third transmission circuit 560, and capacitor C3.

Voltage generation circuit 540 generates internal voltages REF3 and REF4 related to second voltage VDDP. Voltage generation circuit 540 includes a plurality of diode-connected PMOS transistors P41, P43 and P45. Internal voltage REF3 is generated by diode-connected PMOS transistor P41. Internal voltage REF4 is generated by diode-connected PMOS transistors P43 and P45 connected in series.

First transmission circuit 541 outputs internal voltage REF3 to output terminal TM2 in response to first selection signals A and B. Second transmission circuit 550 outputs internal voltage REF4 to output terminal TM2 in response to second selection signals C and D. Third transmission circuit 560 outputs ground voltage VSS to output terminal TM2 in response to inverted first indication signal Ls_SP0B. Capacitor C3 is connected between second voltage terminal for the supply of second voltage VDDP and output terminal TM2. Capacitor C3 may function to stabilize the level of second sourcing control signal Pg_bias output through output terminal TM2.

An exemplary embodiment in accordance with principles of inventive concepts of sourcing control circuit 140' illustrated in FIG. 3C or 5C is depicted in the block diagram of FIG. 6B. Sourcing control circuit 140' illustrated in FIG. 6B may have substantially the same structure as sourcing control circuit 140 illustrated in FIG. 6A, except for third control signal generation circuit 500'.

The third control signal generation circuit 500' generates third sourcing control signal Pg_bias2 in response to inverted first indication signal Ls_SP0B and selection signals A, B, C and D.

The structure of third control signal generation circuit 500' may be the same as that of second control signal generation circuit 500. Accordingly, third sourcing control signal Pg_bias2 may be the same as second sourcing control signal Pg_bias. In an exemplary embodiment in accordance with principles of inventive concepts, sourcing control circuit 140' may not include third control signal generation circuit 500' and may apply second sourcing control signal Pg_bias generated using only second control signal generation circuit 500 to the gates of PMOS transistors P1 and P1' illustrated in FIG. 3C or 5C.

Figure 13:
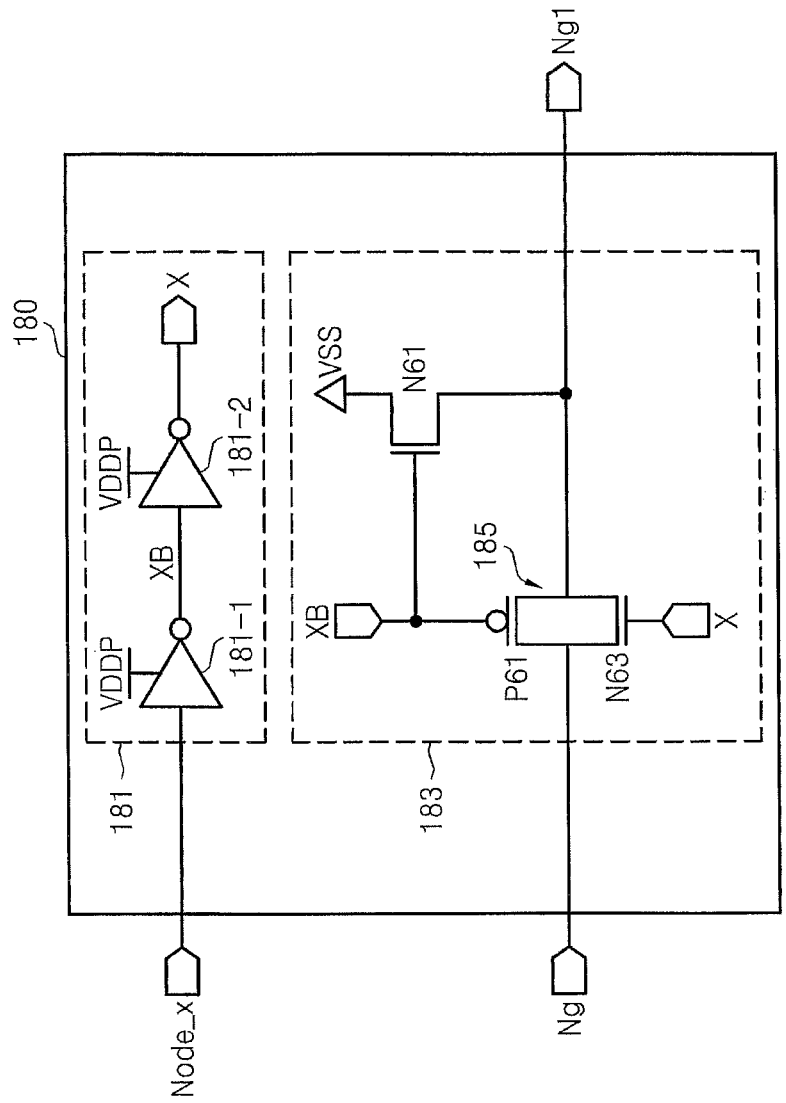
FIG. 13 is a circuit diagram of a sinking control circuit illustrated in FIG. 3A, 3B, 3C, 5A, 5B or 5C.

An exemplary embodiment in accordance with principles of inventive concepts of sinking control circuit 180 illustrated in FIG. 3A, 3B, 3C, 5A, 5B or 5C is depicted in the circuit diagram of FIG. 13. Sinking control circuit 180 may control the operation, for example, "ON" or "OFF", of second sinking circuit 170 or 170' in response to a signal, for example, C (=Node_x), among selection signals A, B, C and D, and data Ng output from second buffer 112.

Sinking control circuit 180 prevents the transition time, propagation delay time and/or duty ratio of buffered output data OUT output through pad 10-6 from changing due to a difference between the number of PMOS transistors (P0 and P1 or P0, P1 and P1') included in sourcing circuit 150 or 150' and the number of NMOS transistors (N0 and N1 or N0, N1 and N1') included in first sinking circuit 160 or 160'.

That is, sinking control circuit 180 may stabilize buffered output data OUT output through pad 10-6 by turning on or off the NMOS transistor N3 according to the DC level of first voltage VDDO.

Sinking control circuit 180 includes control signal generation circuit 181 and sinking control signal generation circuit 183. Control signal generation circuit 181 generates control signals XB and X, complementary to each other, from a signal, for example C (=Node_x), among selection signals A, B, C and D. Control signal generation circuit 181 includes inverters 181-1 and 181-2 connected in series to each other Sinking control signal generation circuit 183 controls the transmission of data Ng output from second buffer 112 in response to complementary control signals XB and X.

When the DC level of first voltage VDDO is the first or third level V1 or V3, as described in the discussion related to FIG. 7, sinking control signal generation circuit 183 applies data Ng output from second buffer 112 to the gate of NMOS transistor N3 as sinking control signal Ng1. Accordingly, when data Ng is logic 1, NMOS transistors N1 and N3 are turned on. When data Ng is logic 0, NMOS transistors N1 and N3 are turned off.

However, when the DC level of first voltage VDDO is the second level V2, selection signal C is logic 0 and, therefore, output signal XB of inverter 181-1 is logic 1 and output signal X of inverter 181-2 is logic 2. Accordingly, transmission circuit 185 is cut off and NMOS transistor N61 is turned on and, as a result, NMOS transistor N3 is turned off.

Figure 14:
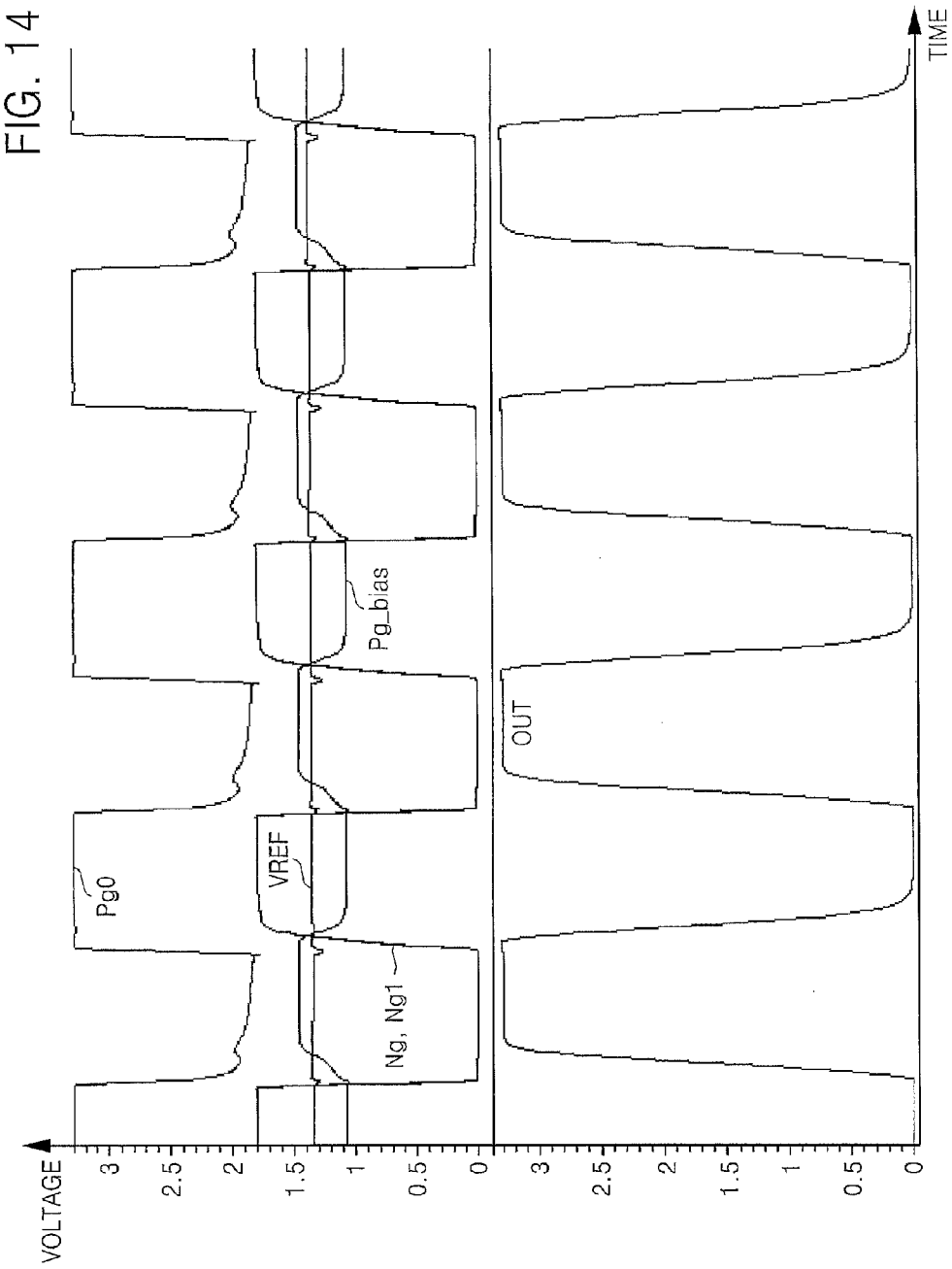
FIG. 14 is a diagram showing the waveforms of signals involved in the operation of the output buffer circuit illustrated in FIG. 3A, 3B, 3C, 5A, 5B or 5C according to some exemplary embodiments in accordance with principles of inventive concepts.

FIG. 14 is a diagram showing waveforms of signals involved in the operation of output buffer circuit 130A, 130B or 130C illustrated in FIG. 3A, 3B, 3C, 5A, 5B or 5C according to an exemplary embodiments in accordance with principles of inventive concepts.

FIG. 14 shows simulation waveforms when first voltage VDDO is 3.3 V, second voltage VDDP is 1.8 V, third voltage VDD is 0.9 V and the operating frequency of output buffer circuit 130A, 130B or 130C is 133 Mhz. In this exemplary embodiment, reference voltage VREF output from reference voltage generation circuit 300 is 1.4 V; first sourcing control signal Pg0 swings between (also referred to herein as, "takes on values") first voltage VDDO, i.e., 3.3 V and (VREF+Vth_P23), i.e., 1.8 V; second sourcing control signal Pg_bias swings centered around reference voltage VREF; signals Ng and Ng1 swing between 0 V and 1.8 V; and the buffered output data OUT swings between 0V and 3.3 V.

Figure 15:
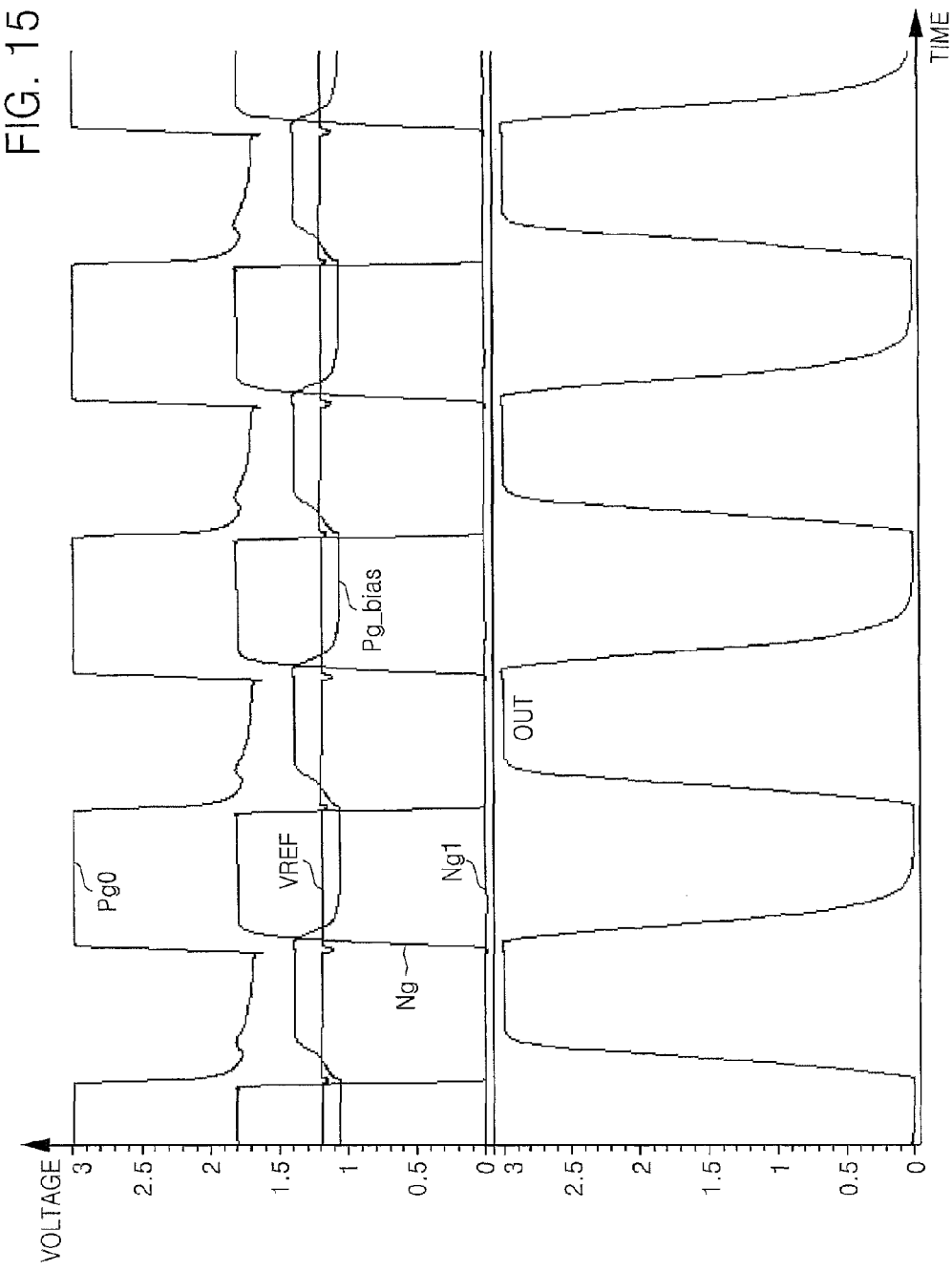
FIG. 15 is a diagram showing the waveforms of signals involved in the operation of the output buffer circuit illustrated in FIG. 3A, 3B, 3C, 5A, 5B or 5C according to other exemplary embodiments in accordance with principles of inventive concepts.

FIG. 15 is a diagram showing waveforms of signals involved in the operation of output buffer circuit 130A, 130B or 130C illustrated in FIG. 3A, 3B, 3C, 5A, 5B or 5C according to exemplary embodiments in accordance with principles of inventive concepts.

FIG. 15 shows simulation waveforms when first voltage VDDO is 3.0 V, second voltage VDDP is 1.8 V, third voltage VDD is 0.9 V, and operating frequency of the output buffer circuit 130A, 130B or 130C is 133 Mhz.

In this exemplary embodiment, reference voltage VREF output from reference voltage generation circuit 300 is 1.2 V; first sourcing control signal Pg0 swing between first voltage VDDO, i.e., 3.0 V and (VREF+Vth_P23), i.e., 1.6 V; second sourcing control signal Pg_bias swings centered around the reference voltage VREF; signal Ng swings between 0 V and 1.8 V; sinking control signal Ng1 is maintained at ground voltage VSS; and buffered output data OUT swings between 0V and 3.0 V.

Figure 16:
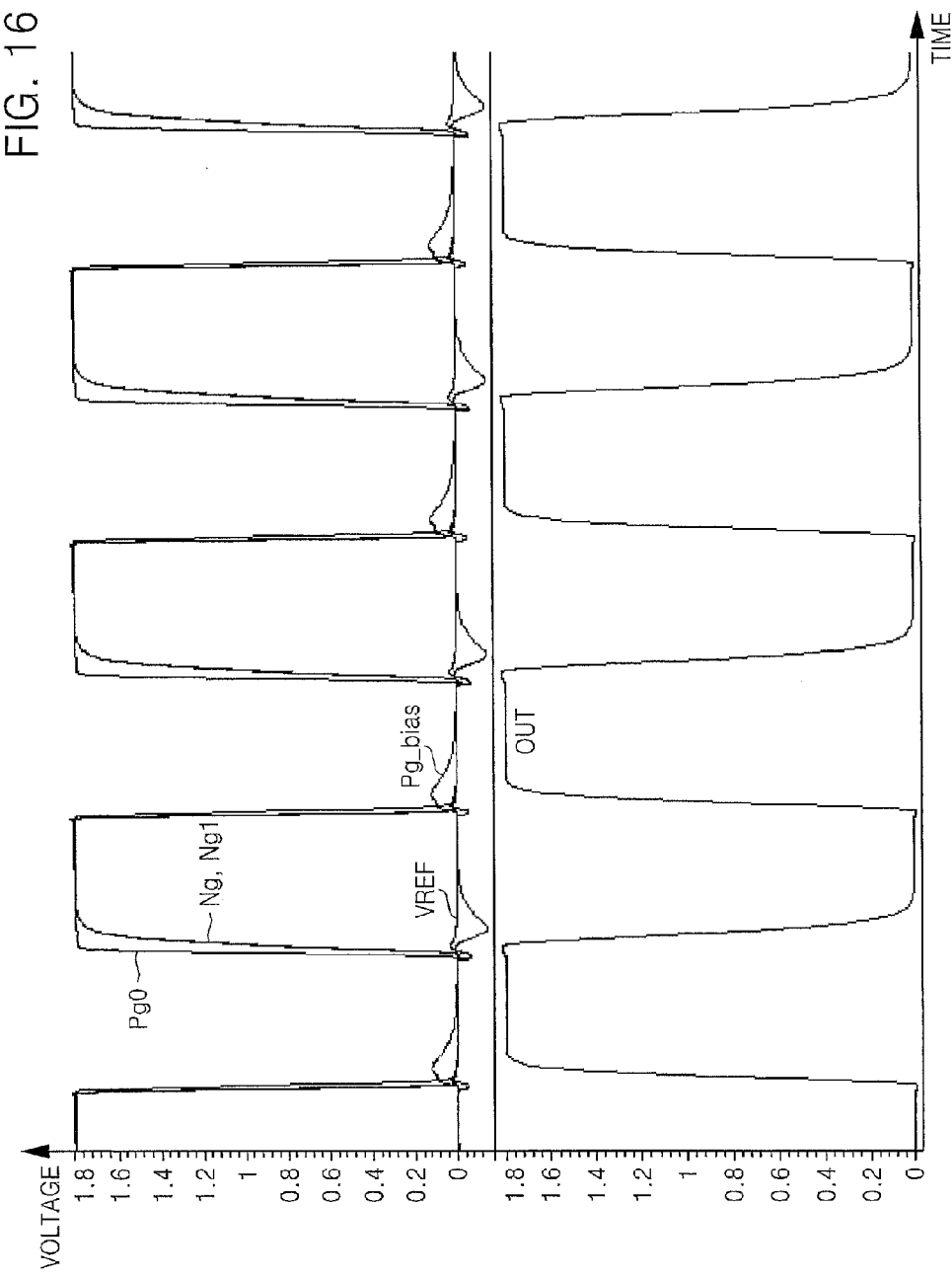
FIG. 16 is a diagram showing the waveforms of signals involved in the operation of the output buffer circuit illustrated in FIG. 3A, 3B, 3C, 5A, 5B or 5C according to further exemplary embodiments in accordance with principles of inventive concepts.

FIG. 16 is a diagram showing waveforms of signals involved in the operation of output buffer circuit 130A, 130B or 130C illustrated in FIG. 3A, 3B, 3C, 5A, 5B or 5C according to exemplary embodiments in accordance with principles of inventive concepts.

FIG. 16 shows simulation waveforms when first voltage VDDO is 1.8 V, second voltage VDDP is 1.8 V, third voltage VDD is 0.9 V, and the operating frequency of output buffer circuit 130A, 130B or 130C is 133 Mhz. In this exemplary embodiment, reference voltage VREF output from reference voltage generation circuit 300 is 0.0 V; first sourcing control signal Pg0 swing between 0.0 V and 1.8 V; signals Ng and Ng1 swing between 0 V and 1.8 V; second sourcing control signal Pg_bias is maintained at ground voltage VSS; and buffered output data OUT swings between 0V and 1.8 V.

As described with reference to FIGS. 1 through 16, sourcing control circuit 140 or 140' generates first sourcing control signal Pg0 having a swing range dependent on first voltage VDDO and reference voltage VREF, even when the withstand voltage of the PMOS transistor P0 is 1.8 V and first voltage VDDO has a value in a range from 1.8 V to 3.3 V, thereby operating at high speed without damaging the gate oxide of PMOS transistor P0.

Figure 17:
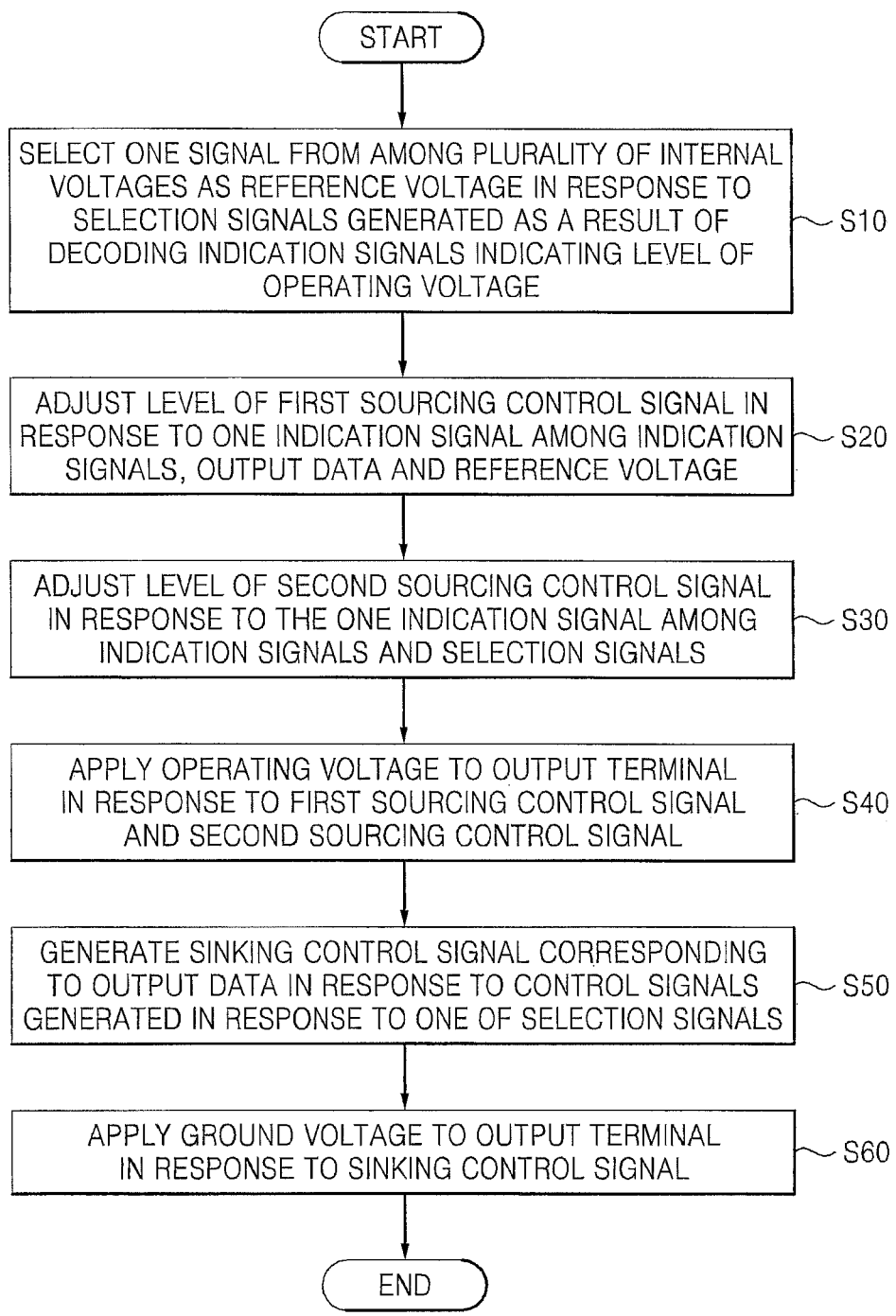
FIG. 17 is a flowchart of an operating method of the output buffer circuit illustrated in FIG. 3A, 3B, 3C, 5A, 5B or 5C according to some exemplary embodiments in accordance with principles of inventive concepts.

FIG. 17 is a flowchart of an operating method of output buffer circuit 130A, 130B or 130C illustrated in FIG. 3A, 3B, 3C, 5A, 5B or 5C according to an exemplary embodiments in accordance with principles of inventive concepts.

Sourcing control circuit 140 or 140' selects a voltage from among internal voltages REF1, REF2 and VSS in FIG. 6 or REF1, REF2' and VSS in FIG. 7 as the reference voltage VREF in response to selection signals A, B, C and D generated as a result of decoding indication signals Ls_SP0 and Ls_SP1 which indicate the DC level of the operating voltage, e.g., first voltage VDDO in operation S10.

Sourcing control circuit 140 or 140' adjusts the swing level of first sourcing control signal Pg0 in response to an indication signal (e.g., Ls_SP0B) among indication signals (e.g., Ls_SP0 and Ls_SP1), output data Ls_data and reference voltage VREF in operation S20. The swing level of first sourcing control signal Pg0 depends on the operating voltage VDDO and reference voltage VREF.

Sourcing control circuit 140 or 140' adjusts the level of second sourcing control signal Pg_bias in response to an indication signal (e.g., Ls_SP0B) among indication signals (e.g., Ls_SP0 and Ls_SP1) and selection signals A, B, C and D in operation S30. Sourcing control circuit 140 or 140' provides operating voltage VDDO to output terminal 151 according to first sourcing control signal Pg0 and second sourcing control signal Pg_bias in operation S40.

Sinking control circuit 180 generates sinking control signal Ng1 corresponding to data Ng output from second buffer 112 in response to complementary control signals XB and X generated in response to a signal (e.g., C) among selection signals A, B, C and D in operation S50. Second sinking circuit 170 or 170' applies ground voltage VSS to output terminal 151 in response to sinking control signal Ng1 in operation S60.

Figure 18:
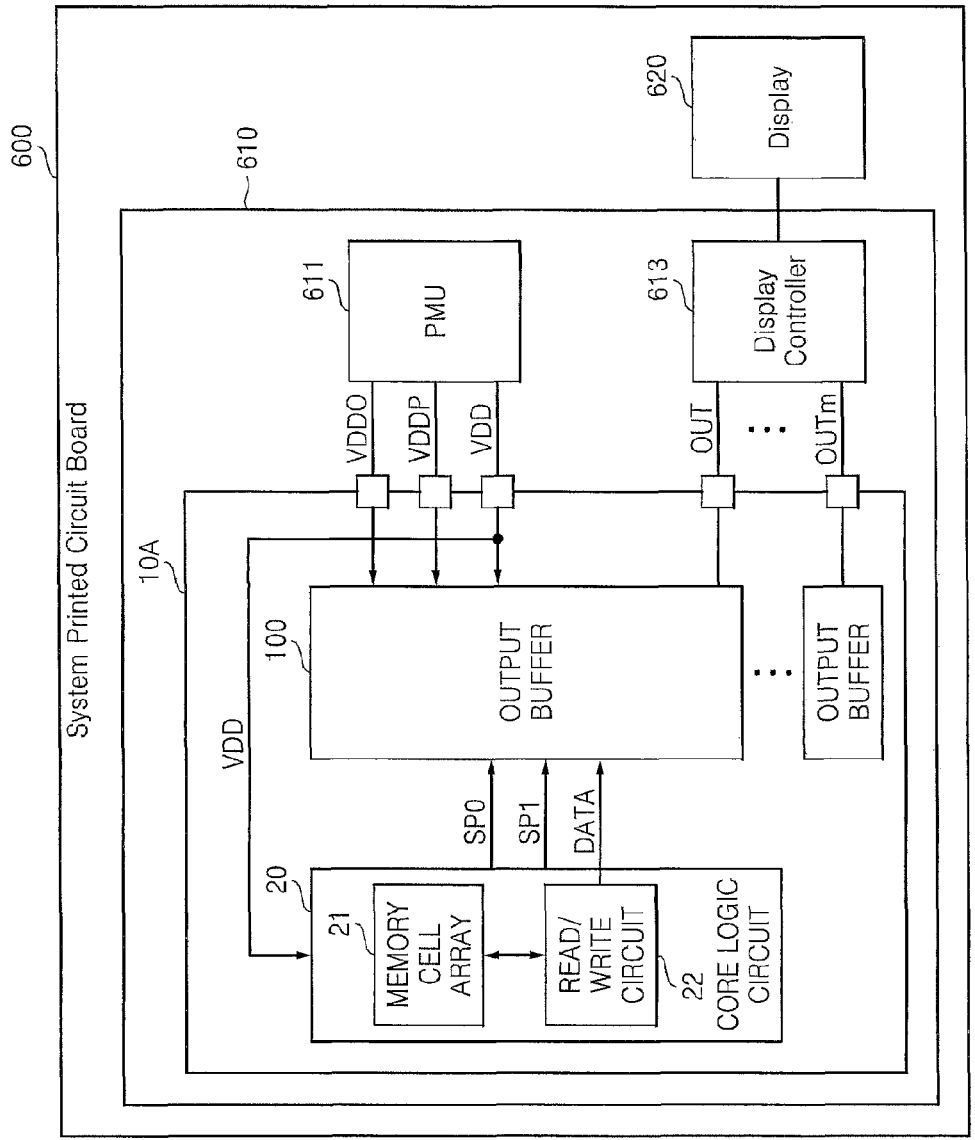
FIG. 18 is a block diagram of a data processing system including the semiconductor device illustrated in FIG. 1.

FIG. 18 is a block diagram of a data processing system 600 including semiconductor device 10A in accordance with principles of inventive concepts, illustrated in FIG. 1. Data processing system 600 may be implemented by a printed circuit board (PCB)-based system and may include system-on-a-chip (SoC) 610 and display 620.

In an exemplary embodiment in accordance with principles of inventive concepts, data processing system 600 may be implemented as a part of a portable device (or computing system) such as a mobile phone, a smart phone, a table person computer (PC), a personal digital assistant (PDA), a portable multimedia player (PMP), an MP3 player or a memory card, for example. SoC 610 includes semiconductor device 10A in accordance with principles of inventive concepts, a power management unit (PMU) 611 and a display controller 613.

PMU 611 may provide voltages VDDO, VDDP and VDD to semiconductor device 10A through pads 10-1 through 10-3, respectively. Display controller 613 may receive buffered data OUT through OUTm output from semiconductor device 10A and transmit them to display 620. Buffered data OUT through OUTm may be output from output buffer circuits, respectively. The structure of each output buffer circuit may be substantially the same as that of output buffer circuit 130A, 130B or 130C described in the discussion related to FIG. 3A, 3B, 3C, 5A, 5B or 5C.

Figure 19:
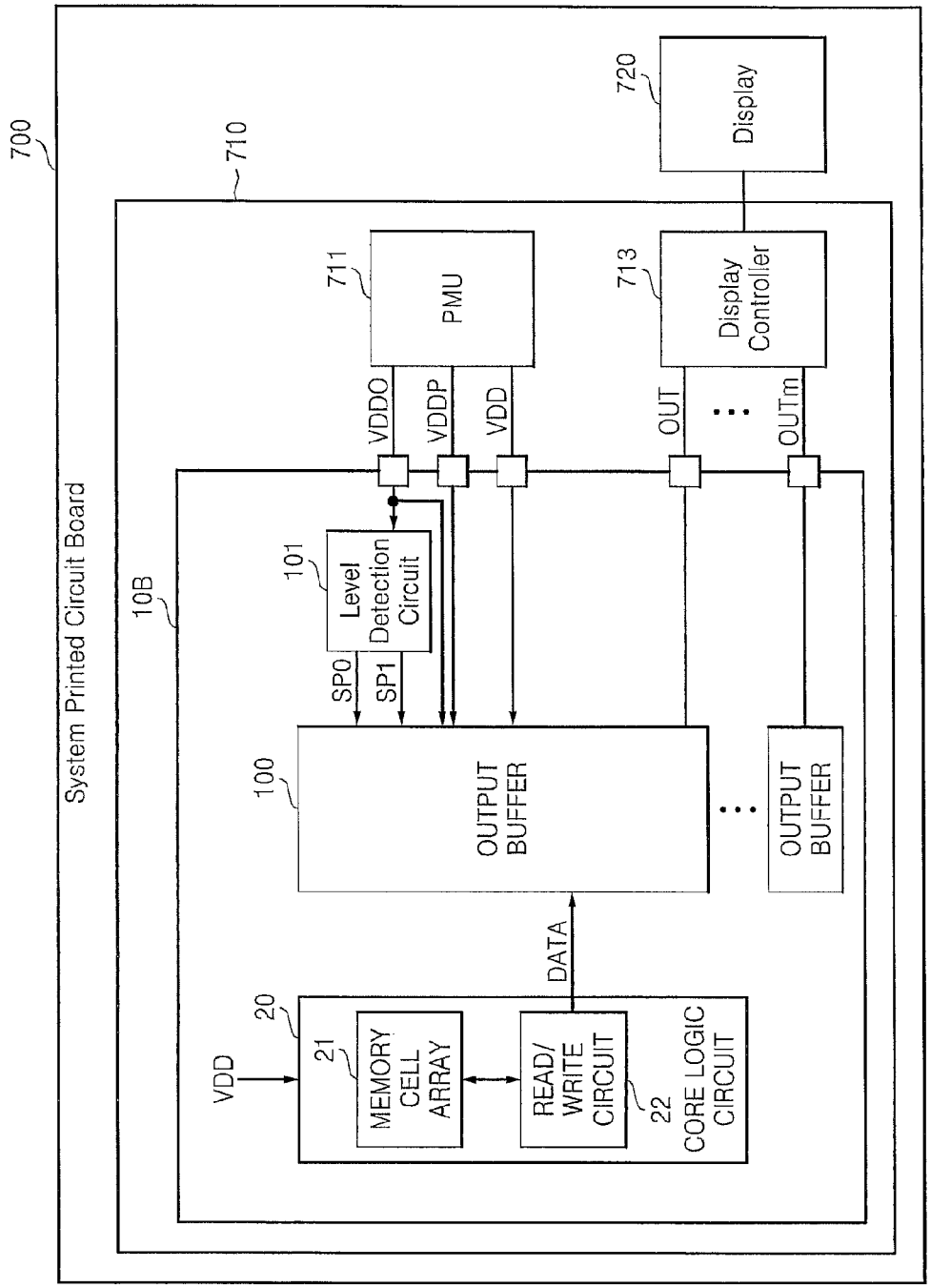
FIG. 19 is a block diagram of a data processing system including the semiconductor device illustrated in FIG. 2.

FIG. 19 is a block diagram of a data processing system 700 including semiconductor device 10B illustrated in FIG. 2. Data processing system 700 may be implemented by a PCB-based system and may include SoC 710 and a display 720.

Data processing system 700 may be implemented as a part of a portable device such as a mobile phone, a smart phone, a table PC, a PDA, a PMP, an MP3 player or a memory card, for example.

SoC 710 includes the semiconductor device 10B in accordance with principles of inventive concepts, a PMU 711 and a display controller 713. PMU 711 may provide voltages VDDO, VDDP and VDD to semiconductor device 10B through pads 10-1 through 10-3, respectively. Display controller 713 may receive buffered data OUT through OUTm output from semiconductor device 10B and transmit them to display 720. Buffered data OUT through OUTm may be output from output buffer circuits, respectively. The structure of each output buffer circuit may be substantially the same as that of output buffer circuit 130A, 130B or 130C described in the discussion related to FIG. 3A, 3B, 3C, 5A, 5B or 5C.

An output buffer circuit according to an exemplary embodiments in accordance with principles of inventive concepts may improve the performance, e.g., the transition time, the propagation delay time and/or the duty ratio, of an output signal according to a supply voltage and does not require a separate bias circuit. In addition, output buffer circuit in accordance with principles of inventive concepts buffers output data at high speed and secures the reliability of gate oxide of a PMOS transistor used in a main driver.

While the present inventive concept has been particularly shown and described with reference to exemplary embodiments thereof, it will be understood that various changes in forms and details may be made therein without departing from the spirit and scope of inventive concepts as defined by the following claims.

What is claimed is:

1. A method of operating an output buffer circuit, the method comprising:
   generating a first sourcing control signal responsive to indication signals indicating an operating voltage and output data;
   generating a second sourcing control signal responsive to the indication signals; and
   applying the operating voltage to an output terminal in response to the first sourcing control signal and the second sourcing control signal, wherein the indication signals and the output data have been level-shifted by a level shifter.

2. The method of claim 1, wherein the first sourcing control signal swings between the operating voltage and a reference voltage, and the reference voltage is a signal selected from among a plurality of internal voltages based on selection signals generated as a result of decoding the indication signals.

3. The method of claim 1, wherein the generating the first sourcing control signal comprises:
   generating selection signals by decoding the indication signals;
   selecting a voltage from among a plurality of internal voltages as a reference voltage in response to the selection signals and one of the indication signals; and
   generating the first sourcing control signal which swings between the operating voltage and the reference voltage in response to the reference voltage, the output data and the one of the indication signals.

4. The method of claim 1, wherein the generating the second sourcing control signal comprises generating a signal among a plurality of internal voltages as the second sourcing control signal in response to selection signals generated by decoding the indication signals and one of the indication signals.

5. The method of claim 1, further comprising:
   generating a sinking control signal in response to the output data and one of selection signals generated by decoding the indication signals; and
   applying a ground voltage to the output terminal in response to the sinking control signal.

6. The method of claim 5, wherein the generating the sinking control signal comprises:
   generating control signals complementary to each other in response to the one of the selection signals; and
   outputting the output data as the sinking control signal in response to the complementary control signals.

7. An output buffer circuit comprising:
   a sourcing control circuit to generate a first sourcing control signal, which depends on indication signals indicating a direct current (DC) level of a first voltage and output data, and a second sourcing control signal which depends on the indication signals; and
   a sourcing circuit to apply the first voltage to an output terminal in response to the first sourcing control signal and the second sourcing control signal.

8. The output buffer circuit of claim 7, wherein the sourcing control circuit generates a voltage among a plurality of internal voltages as a reference voltage in response to selection signals generated as a result of decoding the indication signals and one of the indication signals and generates the first sourcing control signal having a swing range determined by the first voltage and the reference voltage.

9. The output buffer circuit of claim 7, wherein the sourcing control circuit generates a voltage among a plurality of internal voltages as the second sourcing control signal in response to selection signals generated as a result of decoding the indication signals and one of the indication signals.

10. The output buffer circuit of claim 7, wherein the sourcing control circuit comprises:
    a decoding circuit to decode the indication signals and output selection signals;
    a reference voltage generation circuit to output a voltage among a plurality of first internal voltages as a reference voltage in response to a first indication signal among the indication signals and the selection signals;
    a first control signal generation circuit to generate the first sourcing control signal having a swing range determined by the output data, the first indication signal and the reference voltage; and
    a second control signal generation circuit to generate a voltage among a plurality of second internal voltages as the second sourcing control signal in response to the first indication signal and the selection signals.

11. The output buffer circuit of claim 10, wherein the decoding circuit comprises:
    a first selection signal generation circuit to generate first selection signals, which are included in the selection signals and complementary to each other, in response to the first indication signal and a second indication signal among the indication signals; and
    a second selection signal generation circuit to generate second selection signals, which are included in the selection signals and complementary to each other, in response to an inverted first indication signal and the second indication signal.

12. The output buffer circuit of claim 10, wherein the first control signal generation circuit outputs the first sourcing control signal which swings between the first voltage and the reference voltage.

13. The output buffer circuit of claim 10, wherein the first control signal generation circuit outputs the first sourcing control signal which swings between the first voltage and a sum of the reference voltage and a threshold voltage of a metal oxide semiconductor (MOS) transistor operating in response to the reference voltage.

14. The output buffer circuit of claim 7, wherein when the sourcing circuit provides the first voltage to the output terminal in response to the first sourcing control signal, the second sourcing control signal, and a third sourcing control signal, the sourcing control circuit further generates the third sourcing control signal in response to the indication signals.

15. The output buffer circuit of claim 14, wherein the sourcing control circuit comprises:
    a decoding circuit to decode the indication signals and output selection signals;
    a reference voltage generation circuit to output a voltage among a plurality of first internal voltages as a reference voltage in response to a first indication signal among the indication signals and the selection signals;

a first control signal generation circuit to generate the first sourcing control signal having a swing range determined by the output data, the first indication signal and the reference voltage;

a second control signal generation circuit to generate a voltage among a plurality of second internal voltages as the second sourcing control signal in response to the first indication signal and the selection signals; and a third control signal generation circuit to generate the third sourcing control signal which is the same as the second sourcing control signal in response to the first indication signal and the selection signals.

16. The output buffer circuit of claim 7, further comprising:

a first sinking circuit to apply a ground voltage to the output terminal in response to the output data;

a second sinking circuit to apply the ground voltage to the output terminal in response to a sinking control signal; and a sinking control circuit to generate the sinking control signal in response to the output data and a signal among selection signals generated as a result of decoding the indication signals.

17. The output buffer circuit of claim 16, wherein the sinking control circuit comprises:

a control signal generation circuit to generate control signals complementary to each other in response to the signal among the selection signals; and a sinking control signal generation circuit to output the output data as the sinking control signal in response to the complementary control signals.

18. A system on chip (SoC) comprising:

a core logic circuit; and an output buffer circuit to buffer output data of the core logic circuit, wherein the output buffer circuit includes;

a sourcing control circuit to generate a first sourcing control signal having a swing range responsive to an operating voltage and a reference voltage in response to indication signals indicating a direct current (DC) level of the operating voltage and the output data and generate a second sourcing control signal responsive to the indication signals; and a sourcing circuit to apply the operating voltage to an output terminal in response to the first sourcing control signal and the second sourcing control signal.

19. The SoC of claim 18, wherein the sourcing control circuit generates a voltage among a plurality of first internal voltages as the reference voltage in response to selection signals generated as a result of decoding the indication signals and one of the indication signals and generates a voltage among a plurality of second internal voltages as the second sourcing control signal in response to the selection signals and the one of the indication signals.

20. The SoC of claim 18, further comprising:

a first sinking circuit to apply a ground voltage to the output terminal in response to the output data;

a second sinking circuit to apply the ground voltage to the output terminal in response to a sinking control signal; and a sinking control signal generation circuit to generate the sinking control signal in response to the output data and one of the indication signals.

21. The SoC of claim 18, further comprising a plurality of pads to receive the indication signals.

22. The SoC of claim 18, wherein the indication signals and the output data are output from the core logic circuit.

23. The SoC of claim 18, further comprising a level detection circuit to detect the DC level and generate the indication signals.

* * * * *